US008369100B2

(12) United States Patent
Azuma et al.

(10) Patent No.: US 8,369,100 B2
(45) Date of Patent: Feb. 5, 2013

(54) POWER CONVERTER

(75) Inventors: Katsunori Azuma, Hitachi (JP);
Masamitsu Inaba, Hitachi (JP);
Mutsuhiro Mori, Mito (JP); Kenichiro Nakajima, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 37 days.

(21) Appl. No.: 13/037,888

(22) Filed: Mar. 1, 2011

(65) Prior Publication Data
US 2011/0149625 A1    Jun. 23, 2011

Related U.S. Application Data

(63) Continuation of application No. 12/714,899, filed on Mar. 1, 2010, now Pat. No. 8,243,463, which is a continuation of application No. 11/600,124, filed on Nov. 16, 2006, now Pat. No. 7,974,101.

(30) Foreign Application Priority Data

Nov. 17, 2005    (JP) .................................. 2005-332897

(51) Int. Cl.
*H05K 1/16*    (2006.01)
(52) U.S. Cl. ......... 361/766; 361/775; 361/777; 361/784
(58) Field of Classification Search .......... 361/775–777, 361/782–784; 257/691–692
See application file for complete search history.

(56) References Cited

U.S. PATENT DOCUMENTS

| 4,777,558 | A | 10/1988 | Endo |
| 5,729,450 | A | 3/1998 | Dimino et al. |
| 5,879,833 | A | 3/1999 | Yoshii et al. |
| 6,028,779 | A | 2/2000 | Sakamoto et al. |
| 6,340,877 | B1 | 1/2002 | Mita et al. |
| 6,713,888 | B2 | 3/2004 | Kajiura |
| 6,843,335 | B2 | 1/2005 | Shirakawa et al. |
| 7,092,238 | B2 | 8/2006 | Saito et al. |
| 2003/0031038 | A1 | 2/2003 | Shirakawa et al. |
| 2006/0208660 | A1* | 9/2006 | Shinmura et al. ......... 315/209 R |

FOREIGN PATENT DOCUMENTS

| JP | 9-205778 A | 8/1997 |
| JP | 9-308267 A | 11/1997 |
| JP | 11-3837 A | 1/1999 |
| JP | 11-89247 A | 3/1999 |
| JP | 2000-60145 A | 2/2000 |
| JP | 2000-152662 A | 5/2000 |
| JP | 2000-195753 A | 7/2000 |
| JP | 2001-211661 A | 8/2001 |
| JP | 2001-268942 A | 9/2001 |

(Continued)

OTHER PUBLICATIONS

Japanese Office Action including partial English language translation dated Apr. 19, 2011 (Thirty-three (33) pages).

(Continued)

*Primary Examiner* — Tuan T Dinh
(74) *Attorney, Agent, or Firm* — Crowell & Moring LLP

(57) ABSTRACT

A power converter is disclosed in which the structure of a connecting portion is highly resistant against vibration and has a low inductance. The power converter includes a plurality of capacitors and a laminate made up of a first wide conductor and a second wide conductor joined in a layered form with an insulation sheet interposed between the first and second wide conductors. The laminate comprises a first flat portion including the plurality of capacitors, which are supported thereon and electrically connected thereto, a second flat portion continuously extending from the first flat portion while being bent, and connecting portions formed at ends of the first flat portion and the second flat portion and electrically connected to the exterior.

12 Claims, 12 Drawing Sheets

FOREIGN PATENT DOCUMENTS

| | | |
|---|---|---|
| JP | 2003-9546 A | 1/2003 |
| JP | 2003-18863 A | 1/2003 |
| JP | 2003-133172 A | 5/2003 |
| JP | 2004-165309 A | 6/2004 |
| JP | 2005-012940 A | 1/2005 |

OTHER PUBLICATIONS

European Search Report dated Mar. 1, 2007 (six (6) pages).
European Search Reprot dated Jan. 17, 2011.

* cited by examiner

POWER CONVERTER

This application is a continuation of U.S. patent application Ser. No. 12/714,899, filed Mar. 1, 2010, which is a continuation of U.S. patent application Ser. No. 11/600,124, filed Nov. 16, 2006, which in turn claims the priority of Japanese application 2005-332897, filed Nov. 17, 2005. The entire disclosure of each of the above-identified applications is incorporated herein by reference.

BACKGROUND OF THE INVENTION

1. Field of the Invention

The present invention relates to a capacitor module, a power converter, and a vehicle-mounted electrical-mechanical system.

2. Description of the Related Art

Recently, a power semiconductor device capable of switching a large current has been developed. A power converter using such a power semiconductor device is able to supply electric power to a load, e.g., a motor, with high efficiency through the switching. Therefore, the power semiconductor device is widely utilized for driving motors of vehicle-mounted electrical-mechanical systems in trains, automobiles, etc. In a hybrid electric vehicle (HEV), particularly, an engine and an electric motor are combined with each other to realize outputting of higher torque from low rotation speed of the motor, storage of regenerative energy into a battery, as well as higher fuel economy and a reduction of $CO_2$ in cooperation with an idle stop system (automatic engine stop system).

The power semiconductor device used in the power converter generates a loss at the time of switching. If the switching loss can be reduced, it is possible to reduce heat generated from the power converter, to cut the number of power semiconductor devices used, and to realize a power converter having a smaller size and a higher power density.

To reduce the switching loss, the switching time has to be shortened. In other words, an effective solution for reducing the switching loss is to increase a current time-dependent change di/dt and to realize faster switching. At the time of switching of a large current, however, a jumping voltage, i.e., an overvoltage in excess of the power supply voltage, is caused in the power semiconductor device based on L·di/dt, i.e., based on a abrupt current time-dependent change di/dt and a parasitic inductance L of wiring. Taking into account the jumping voltage, the power semiconductor device of the power converter employs a device that is resistant against a voltage higher than the power supply voltage. Reducing the parasitic inductance L of wiring is required to suppress the jumping voltage and to reduce the loss.

Parts of the power converter, of which inductances are to be reduced, are ones used in a circuit subjected to a momentary current change at the time of switching, i.e., a smoothing capacitor, a power semiconductor module using the power semiconductor device, and conductors used for connecting them. In those parts, it is important to reduce a total inductance, including part connecting portions as well.

Known techniques for reducing the inductance of a capacitor are disclosed in Patent Document 1 (JP, A 2001-268942) and Patent Document 2 (JP, A 2004-165309). With those known techniques, the inductance is reduced by arranging a plurality of capacitors on positive and negative conductors in the form of flat plates, which are opposed to each other with insulators interposed between them, and by connecting the capacitors such that electrodes of adjacent capacitors have different polarities, or by connecting a capacitor and a power semiconductor module in proximity relation so as to shorten the distance between them.

SUMMARY OF THE INVENTION

However, a capacitor module constructed by combining a plurality of capacitors with each other is large and weight. Accordingly, when the capacitors are connected in proximity relation as in the known techniques, stresses are concentrated in an electrically connecting portion, thus causing rupture in, e.g., an environment of severe temperature difference within an inverter for the HEV and an environment of severe vibration encountered when the HEV is driven over a road block or other level differences in roads. To avoid that problem, it is proposed to interconnect the capacitor module and the power semiconductor module through a third connecting member for moderation of the stresses. Such a solution, however, increases inductance in the connecting portion and cannot realize a sufficient reduction of inductance.

Further, a capacitor generates heat due to a ripple current, and therefore it is required to have a structure suitable for cooling. In particular, an inverter for the HEV is usually installed in a closed space where the environmental temperature in use is 100° C. or higher and cooling based on convection of air within the space is not expected. For that reason, the capacitor is required to have a shape ensuring high thermal conduction and good thermal contact for heat radiation.

In addition, because the capacitors and the power semiconductor module are arranged side by side on a plane, the known techniques are not suitable for satisfying requirements demanded in the inverter for the HEV, i.e., space-saving installation, wiring with a low inductance, and a layered structure in which the capacitors are installed over the power semiconductor module.

An object of the present invention is to provide a space-saving capacitor module which has not only a connecting structure ensuring a low inductance and moderation of stresses, but also a structure suitable for cooling.

To achieve the above object, the capacitor module of the present invention is featured in reducing parasitic inductance of connecting portions. The capacitor module comprises a plurality of capacitors; and a laminate electrically connected to the plurality of capacitors and made up of a first wide conductor and a second wide conductor joined in a layered form with an insulation sheet interposed between the first and second wide conductors, the laminate comprising a first flat portion including the plurality of capacitors which are supported thereon and electrically connected thereto; a second flat portion being continuous with the first flat portion and extending at a large width in a direction away from the plurality of capacitors supported on the first flat portion; and connecting portions formed at ends of the first flat portion and the second flat portion and electrically connected to the exterior.

Preferably, the first flat portion is resin-molded together with the plurality of capacitors, and the second flat portion is exposed from the molded resin and is extended at a large width in a direction away from the molded resin. Further, a bent portion is formed midway the second flat portion.

Also, the present invention provides a power converter having a small size and a high power density, which employs the capacitor module constituted as described above.

More specifically, in a power converter electrically connected between a power supply and a load and controlling transfer of electric power between the power supply and the load, the present invention is featured in that the capacitor module is electrically connected in parallel to the power supply side of a power module which includes a power semiconductor device for switching and is electrically connected between the power supply and the load.

Further, the present invention provides a vehicle-mounted electrical-mechanical system using the power converter constituted as described above.

More specifically, in a vehicle-mounted electrical-mechanical system for converting electric power supplied from a vehicle-mounted power supply into motive power, the present invention is featured in that the power converter is electrically connected between a motor for generating the motive power the vehicle-mounted power supply and the motor and transfer of electric power between the vehicle-mounted power supply and the motor.

Thus, according to the present invention, the capacitor module can be obtained which has the connecting structure ensuring a low inductance and moderation of stresses and which is suitable for reducing a surge voltage caused at the time of switching in the power converter. The power converter having a small size and a high power density can also be obtained by using the capacitor module, and the vehicle-mounted electrical-mechanical system can further be obtained by using the power converter.

DESCRIPTION OF THE PREFERRED EMBODIMENTS

A capacitor module, a power converter, and a vehicle-mounted electrical-mechanical system according to a first embodiment of the present invention will be described below with reference to FIGS. 1-12.

In the following embodiment, a vehicle-mounted power converter is described, by way of example, as the power converter in which is employed the capacitor module of the present invention.

The construction described below is also applicable to DC-DC power converters, such as a DC/DC converter and a DC chopper. Further, the construction described below is applicable to power converters used for industrial and domestic purposes.

Figure 1:
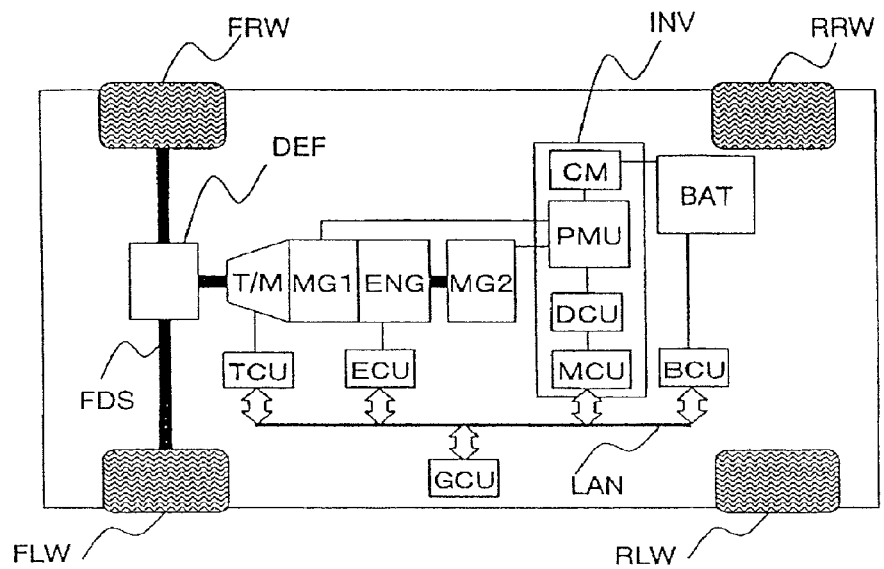
FIG. 1 is a system configuration diagram of a vehicle equipped with a vehicle-mounted electrical-mechanical system according to a first embodiment of the present invention.

FIG. 1 is a block diagram of a hybrid electric vehicle (HEV) in which a vehicle-mounted electrical-mechanical system constructed of a power converter INV using the capacitor module according to the first embodiment of the present invention is combined with an internal combustion engine system.

The HEV to which is applied this first embodiment includes front wheels FRW and FLW, rear wheels RRW and RLW, a front wheel axle FDS, a rear wheel axle RDS, a differential gear DEF, a transmission T/M, an engine ENG, electric motors MG1 and MG2, a power converter INV, a battery BAT, an engine control unit ECU, a transmission control unit TCU, a motor control unit MCU, a battery control unit BCU, and a vehicle-mounted local area network LAN.

In this first embodiment, driving forces are generated by the engine ENG and the two motors MG1, MG2 and are transmitted to the front wheels FRW and FLW through the transmission T/M, the differential gear DEF, and the front wheel axle FDS.

The transmission T/M is constructed by a plurality of gears and is capable of changing a gear ratio depending on an operating condition, such as speed.

The differential gear DEF is a device for, when there is a speed difference between the right and left wheels FRW and FLW in a curved load or the like, distributing motive power to the right and left wheels FRW and FLW in a proper ratio.

The engine ENG is constructed by a plurality of components, such as an injector, a throttle valve, an ignition device, and intake and exhaust valves (all not shown). The injector is a fuel injection valve for controlling an amount of fuel injected into a cylinder of the engine ENG. The throttle valve is a valve for controlling an amount of air supplied to the cylinder of the engine ENG. The ignition device is a fire source for burning a gas mixture in the cylinder of the engine ENG. The intake and exhaust valves are open/close valves disposed in intake and exhaust passages for the cylinder of the engine ENG.

The motors MG1 and MG2 are each a three-phase AC synchronous motor, i.e., a permanent-magnet rotary electric machine.

As an alternative, the motors MG1 and MG2 may be each a three-phase AC inductive rotary electric machine or a reluctance rotary electric machine.

Each of the motors MG1 and MG2 comprises a rotating rotor and a stator generating a rotating magnetic field. The rotor is constructed by embedding a plurality of permanent magnets inside a core, or by arranging a plurality of permanent magnets over the outer circumferential surface of a core. The stator is constructed by winding copper wires around electromagnetic steel plates. By supplying a three-phase AC current to flow through the windings of the stator, the rotating magnetic field is generated such that each motor MG1, MG2 can be rotated by torque generated by the rotor.

The power converter INV controls electric power supplied to the motors MG1 and MG2 through switching of power semiconductor devices. Briefly speaking, the power converter INV controls the motors MG1 and MG2 by establishing (turning on) or cutting (turning off) the connection of a DC source, i.e., the high-voltage battery BAT, to the motors MG1 and MG2. In this first embodiment, because the motors MG1 and MG2 are each a three-phase AC motor, a three-phase AC voltage is generated in accordance with duration of a time width of the switching (i.e., an off- and on-duration), to thereby control the driving forces of the motors MG1 and MG2.

The power converter INV is constituted by a capacitor module CM for supplying electric power momentarily at the time of switching, a power module PMU for performing the switching, a driving circuit unit DCU for supplying switching power for the power module PMU, and a motor control unit MCU for deciding the duration of the time width of the switching.

The capacitor module CM and the power module PMU will be described in detail later with reference to FIG. 3 and the subsequent drawings.

The motor control unit MCU decides the switching of the power module PMU so that a rotation speed command n* and a torque command value $\tau^*$ from a general control unit GCU are realized in the motors MG1 and MG2. In other words, the motor control unit MCU includes a microcomputer and a memory, e.g., a data map, which are required for arithmetic and logical operations to decide the switching.

The driving circuit unit DCU drives the power module PMU in accordance with the switching of the power module PMU, which has been decided by the motor control unit MCU. To that end, the driving circuit unit DCU includes a circuit with a driving capability of several amperes (A) and several tens voltages (V), which is required to drive the power module PMU. Also, the driving circuit unit DCU includes a circuit for isolating a control signal in order to drive power semiconductor devices on the higher potential side.

The battery BAT is a DC power supply and is constituted by a secondary cell with a high power density, e.g., a nickel hydrogen cell or a lithium ion cell. The battery BAT supplies electric power to the motors MG1 and MG2 through the power converter INV, and also conversely stores electric power generated by the motors MG1 and MG2 after conversion in the power converter INV.

The transmission T/M, the engine ENG, the power converter INV, and the battery BAT are controlled by a transmission control unit TCU, an engine control unit ECU, a motor control unit MCU, and a battery control unit BCU, respectively. Those control units are connected to the general control unit GCU via the vehicle-mounted local area network LAN with a capability of two-way communication and are supervised in accordance with command values from the general control unit GCU. Each of those control units controls corresponding equipment based on, e.g., a command signal (command value) from the general control unit GCU, output signals (values of various parameters) from various sensors and the other control units, as well as data and maps which are stored in a storage beforehand.

For example, the general control unit GCU computes a torque value required for the vehicle depending on an amount by which an accelerator is depressed in accordance with a driver's acceleration demand, and distributes the required torque value into an output torque value for the engine ENG and an output torque value for the first motor MG1 so that operation efficiency of the engine ENG is increased. The distributed output torque value for the engine ENG is transmitted as an engine torque command signal to the engine control unit ECU, and the distributed output torque value for the first motor MG1 is transmitted as a motor torque command signal to the motor control unit MCU, thereby controlling the engine ENG and the motor MG1, respectively.

The operation mode of the hybrid electrical vehicle will be described below.

First, when the vehicle starts running or it runs at low speed, the motor MG1 is primarily operated as a motor and the rotational driving force generated by the motor MG1 is transmitted to the front wheel axle FDS through the transmission T/M and the differential gear DEF. As a result, the front wheel axle FDS is rotated by the rotational driving force from the motor MG1 to rotate the front wheels FRW and FLW, thus enabling the vehicle to run. At that time, output power (DC power) from the battery BAT is supplied to the motor MG1 after conversion into three-phase AC power by the power converter INV.

Next, during ordinary running of the vehicle (i.e., running at medium and high speeds), the engine ENG and the motor MG1 are used in a combined manner. More specifically, the rotational driving force generated by the engine ENG and the rotational driving force generated by the motor MG1 are both transmitted to the front wheel axle FDS through the transmission T/M and the differential gear DEF. As a result, the front wheel axle FDS is rotated by the rotational driving forces from the engine ENG and the motor MG1 to rotate the front wheels FRW and FLW, thus enabling the vehicle to run. Also, a part of the rotational driving force generated by the engine ENG is supplied to the motor MG2. With such distribution of motive power, the motor MG2 is rotated by the part of the rotational driving force generated by the engine ENG to operate as a generator, thus generating electric power. The three-phase AC power generated by the motor MG2 is supplied to the power converter INV and is rectified to DC power. Thereafter, the DC power is converted again into three-phase AC power that is supplied to the motor MG1. As a result, the motor MG1 generates the rotational driving force.

During acceleration of the vehicle, in particular, during quick acceleration in which the opening of the throttle valve for controlling the amount of air supplied to the engine ENG is fully opened (e.g., when the vehicle is climbing a steep up-slope and the accelerator is depressed in large amount), output power from the battery BAT is supplied to the motor MG1 after conversion to three-phase AC power by the power converter INV, in addition to the above-described operation during ordinary running, thereby increasing the rotational driving force generated by the motor MG1.

During deceleration or braking of the vehicle, the rotational driving force of a drive shaft (DSF) generated by the rotation of the front wheels FRW and FLW is supplied to the motor MG1 through the differential gear DEF and the transmission T/M, whereby the motor MG1 is operated as a generator to generate electric power. The three-phase AC power (regenerative power) obtained by the power generation is rectified to DC power by the power converter INV, which is then supplied to the battery BAT. The battery BAT is thereby charged. When the vehicle is stopped, the driving of the engine ENG and the motors MG1 and MG2 is stopped in a basic mode. However, when a remaining level of the batter BAT is low, the driving of the engine ENG is continued to operate the motor MG2 as a generator, and the generated electric power is supplied to and charged in the battery BAT through the power converter INV.

The operations of the motors MG1 and MG2 for the power generation and the driving are not limited to particular ones. Depending on efficiency demanded, the motors MG1 and MG2 may be operated to play roles reversal to the above-described ones.

Figure 2:
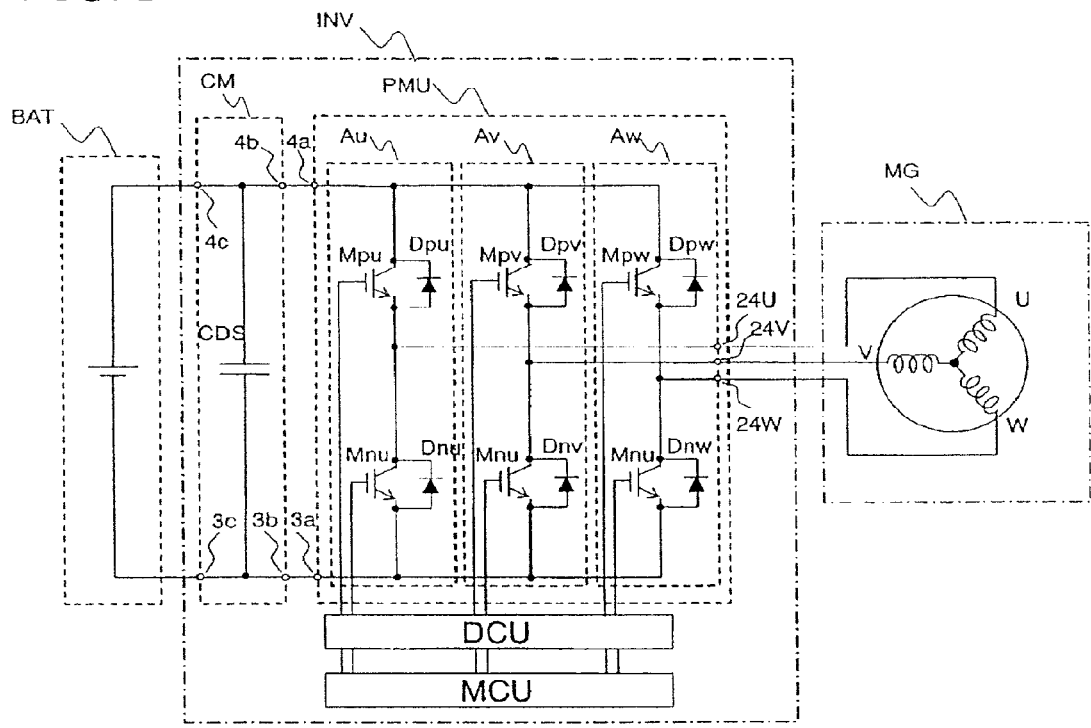
FIG. 2 is a main circuit diagram of a power converter INV used in the vehicle-mounted electrical-mechanical system according to the first embodiment of the present invention.

FIG. 2 is a circuit diagram of a main circuit, in which a large current flows, in the power converter INV for the vehicle-mounted electrical-mechanical system according to the first embodiment of the present invention. Note that, in FIG. 2, the same characters as those in FIG. 1 denote the same parts.

The power converter INV according to this first embodiment is constituted by the capacitor module CM for supplying electric power momentarily at the time of switching, the power module PMU for performing the switching, the driving circuit unit DCU for supplying switching power for the power module PMU, and the motor control unit MCU for controlling the switching waveform to control the motor. While FIG. 2 shows the arrangement of the power converter INV for the first motor MG1, the power converter INV in FIG. 1 includes the power module PMU and the driving circuit unit DCU for the second motor MG2, which have the same arrangements as those shown in FIG. 2.

The power module PMU constitutes three bridge circuits (Au, Av and Aw) for outputting a three-phase AC current by using power semiconductor devices Mpu, Mnu, Mpv, Mnv, Mpw and Mnw which perform the switching (turning-on and -off).

Opposite ends of each of those bridge circuits are connected to connecting portions 3b and 4b of the capacitor module CM through connecting portions 3a and 4a which are connected to the respective opposite ends of the bridge circuits.

Midpoints of the bridge circuits are connected to three-phase input connecting portions (U-, V- and W-connecting portions) of the motor MG1 through connecting portions 24U, 24V and 24W, respectively.

The bridge circuits are each a serial circuit which is constituted by connecting two power semiconductor devices electrically in series per phase, and which is also called an arm. A part of the serial circuit including the power semiconductor device which outputs a higher potential is called an upper arm, and a part thereof including the power semiconductor device which outputs a lower potential is called a lower arm.

The power semiconductor devices of the three bridge circuits (Au, Av and Aw) are subjected to switching (turning-on and -off) with a phase difference of 120° to generate the three-phase AC voltage, thereby switching the connection between the higher potential side (upper arm) and the lower potential side (lower arm). Thus, the three-phase AC voltage having a pulse voltage waveform different in the duration of the time width is generated.

To perform the switching of a large current, the power semiconductor devices (Mpu, Mnu, Mpv, Mnv, Mpw and Mnw) require an external driving source power for the switching. To that end, the driving circuit unit DCU for driving of the switching is connected to the power module PMU.

Further, the motor control unit MCU is connected to the driving circuit unit DCU to receive signals indicating the motor rotation speed, the time width and timing (duration of the pulse width) of the switching depending on torque, etc. from the motor control unit MCU.

In the illustrated circuit diagram of this first embodiment, IGBT (Insulated Gate Bipolar Transistor) is used as each of the power semiconductor devices (Mpu, Mnu, Mpv, Mnv, Mpw and Mnw). Therefore, diodes Dpu, Dnu, Dpv, Dnv, Dpw and Dnw adapted for the power semiconductor devices in which currents are returned at the time of switching are each connected between the collector and the emitter of the IGBT in anti-parallel arrangement (such that the direction from the emitter toward the collector is a forward direction).

Also, while the power semiconductor device in the upper (lower) arm per phase is constituted by one component (two including the associated diode) in the illustrated circuit diagram of this first embodiment, a plurality of power semiconductor devices may be connected in parallel depending on the current capacity demanded.

Further, while IGBT is used as the power semiconductor device in the illustrated circuit diagram of this first embodiment, MOSFET (Metal Oxide Semiconductor Field-Effect Transistor) may be used instead. In the case of MOSFET, since a diode for returning a current is incorporated, there is no need of additionally arranging a diode.

The power module PMU is enclosed by a case, and the power semiconductor devices are mounted on a metal plate, called a base, with an insulating substrate interposed between them. Electrical connections between semiconductor chips, between the semiconductor chips and input terminals, and between the semiconductor chips and output terminals are established so as to form a three-phase circuit by connecting conductors, e.g., aluminum wires or plate-like conductors.

The base is made of a thermally conductive material, e.g., copper or aluminum, and serves to cool heating of the power semiconductor devices caused by the switching. For the cooling, the underside of the base is exposed to a coolant, e.g., air or cooling water. From the viewpoint of increasing the cooling efficiency, it is preferable to provide fins or the likes for increasing the contact area with the coolant. The insulating substrate is made of an insulating material with high thermal conductivity, e.g., aluminum nitride. Boundaries between the base and the insulating substrate and between the insulating substrate and the power semiconductor devices are bonded by using a bonding material, e.g., a solder.

The power module PMU performs the switching of a large current. Therefore, the power module PMU requires a low-impedance circuit which is capable of momentarily changing the current at the time of switching. Because the high-voltage battery BAT includes the internal impedance and the inductance of connecting cables, it has a high impedance and cannot constitute a low-impedance circuit for the power module PMU.

In view of the above point, the capacitor module CM is installed near the power module PMU within the power converter INV and is connected so as to constitute a low-impedance circuit at the time of switching of the power module PMU. More specifically, assuming that the capacity of a capacitor is C and the frequency is f, the capacitor itself has a low impedance of $Z=1/(2 \times \pi \times f \times C)$ at high frequency. However, the parasitic inductance of wirings inside both the capacitor module and the power module and the parasitic inductance of connecting portions between the capacitor module and the power module generate a high impedance $Z=2 \times \pi \times f \times L$, wherein L is the parasitic inductance and f is the frequency, at high frequency caused upon the current being changed momentarily. Further, as a current change dI/dt increases, a jumping voltage $V=L \times dI/dt$ caused by the parasitic inductance L is also increased.

The capacitor module according to this first embodiment is designed to realize the features that inner wirings have a low inductance, and the connecting portions between the capacitor module CM and the power module PMU is constituted as low-inductance connection having a stress moderating structure. Therefore, the switching of the power semiconductor module can be sped up (namely, dI/dt can be increased), and the switching time can be shortened. In other words, a time t during which a large current I and a large voltage V cross each other can be shortened and generated heat $Q=I \times V \times t$ can be held small. With the reduction of the generated heat Q, the temperature of each power semiconductor device can be lowered and the number of the power semiconductor devices can be reduced. It is hence possible to realize a reduction in size and cost of the power converter.

The capacitor module CM according to the first embodiment of the present invention will be described below with reference to FIGS. 3-12.

Figure 3:
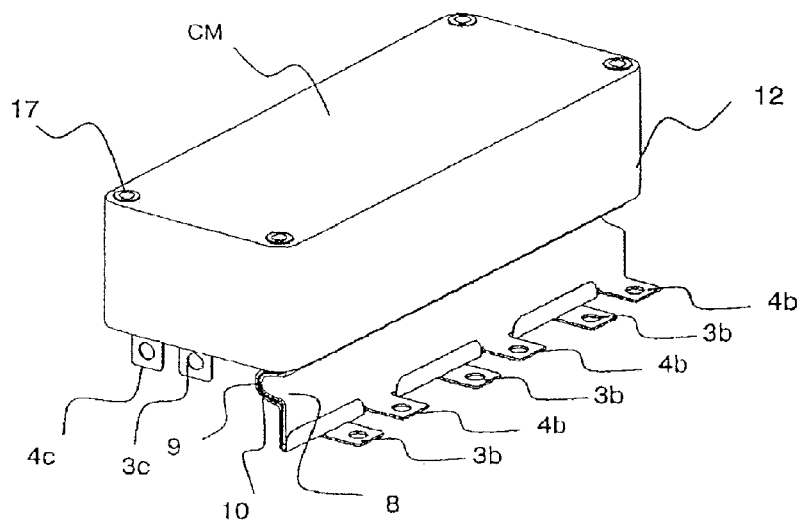
FIG. 3 is a perspective view showing an external appearance of a capacitor module CM according to the first embodiment of the present invention.

FIG. 3 is a perspective view showing an external appearance of the capacitor module CM according to the first embodiment of the present invention. The capacitor module CM is covered with a case 12 for resin molding, and the case 12 has holes 17 which are used for fixing and include nuts buried therein. The case 12 has connecting portions 3c and 4c for connection to the high-voltage battery BAT and connecting portions 3b and 4b for connection to the power module PMU. Further, a laminate (described later) of wide conductors 8 and 9, which support capacitor cells CDSs and are joined in a layered form with an insulation sheet 10 interposed between them, is withdrawn from the case 12 for resin molding, as it is, to extend up to the outside of molded resin, thereby forming the connecting portions 3b and 4b for connection to the power module PMU.

FIGS. 4A and 4B are respectively a sectional view and a partial enlarged view of the capacitor module according to the first embodiment of the present invention.

The capacitor cells CDSs are supported on the laminate of the wide conductors 8 and 9 in the layered form with the insulation sheet 10 interposed between them, and they are electrically connected to the wide conductors 8 and 9 at connecting portions formed at one-side ends of the wide conductors 8 and 9. The capacitor cells CDSs and a part of the laminate are covered with the case 12 having an opening and are molded with resin 13. A bent structure for moderating stresses is provided in a part of the laminate (8, 9 and 10), which is not resin-molded, and the connecting portions 3b (4b) for connection to the power module PMU are formed at the other-side ends of the wide conductors 8 and 9.

The resin 13 used for the molding can be any suitable type so long as it is an insulating material with good thermal conductivity and moisture resistance. By forming holes, projections and/or recesses in the layered wide conductors 8 and 9, adhesion of the wide conductors to the resin is increased and heat generated from the capacitors are more effectively transmitted to the wide conductors, thus resulting in more efficient heat radiation.

The resin-molding case 12 is preferably made of a material having moisture resistance and heat resistance, e.g., PPS. By resin-molding the layered wide conductors 8 and 9, the capacitor module CM is obtained in the form capped by the resin-molding case 12, and therefore moisture resistance of the capacitor cells CDSs can be increased.

Thus, the resin molding contributes to increasing not only reliability at the connecting portions between the capacitor cells CDSs and the wide conductors, but also the cooling capability and moisture resistance as a result of closer adhesion between the capacitor cells CDSs and the wide conductors.

The bent structure and the effect of reducing inductance and moderating stresses with the bent structure will be described below with reference to FIG. 4B which shows a bent portion of the laminate in enlarged scale.

In the structured obtained by bending, into a U-shape, the laminate of the wide conductors 8 and 9 in the layered form with the insulation sheet 10 interposed between them, when stresses are applied in the vertical direction and in the left-and-right direction as viewed on the drawing sheet, those stresses can be moderated. The directions and paths of currents flowing through the wide conductor 8 and the wide conductor 9 are as indicated by 80 and 81, respectively. With the bent structure of the laminate, the currents 80 and 81 flow in directions canceling each other and a low inductance is realized in spite of the length of each wide conductor being increased with the presence of the bent portion. Stated another way, inductance coupling occurs between inductances 67-N and 67-P of the wide conductors 8 and 9 in the bent portion, and resulting inductance can be reduced when the currents 80 and 81 flow through the bent portion at the same time.

Figure 5:
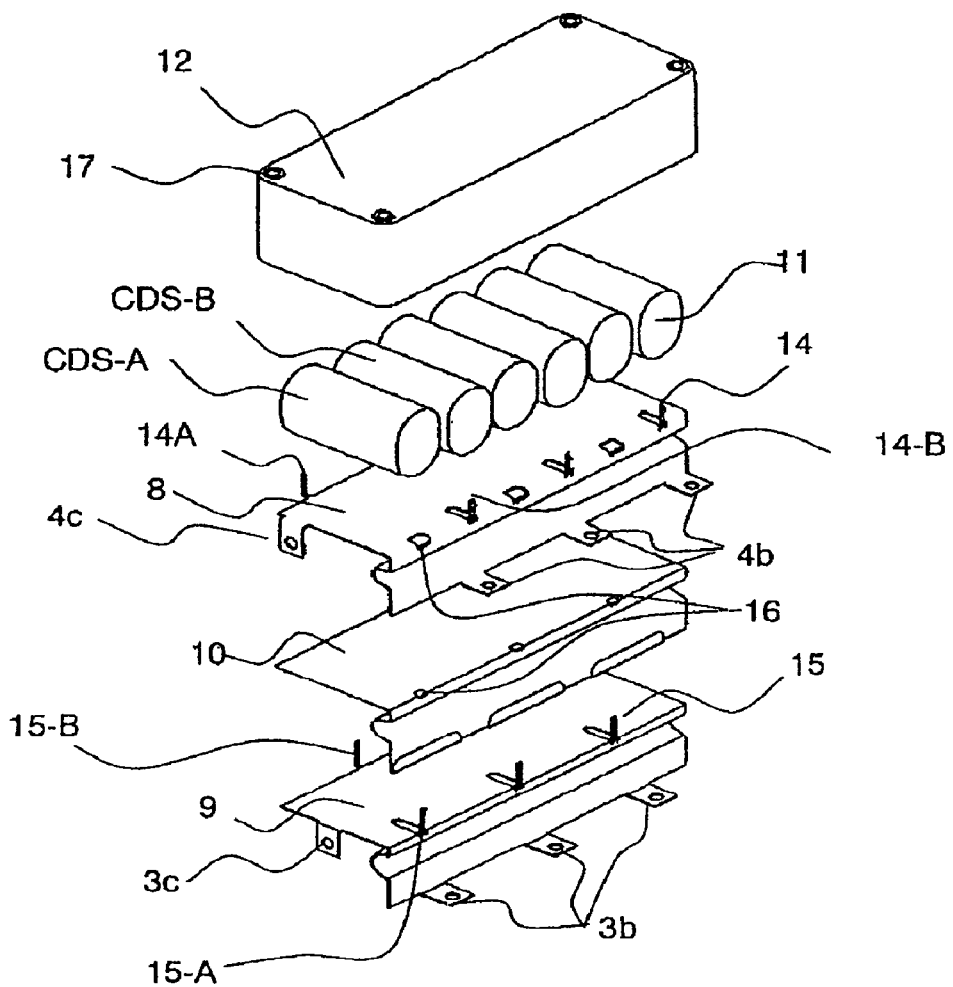
FIG. 5 is an exploded view of the capacitor module according to the first embodiment of the present invention.

FIG. 5 is an exploded view of the capacitor module CM according to the first embodiment of the present invention.

As shown in FIG. 5, the capacitor cells CDSs constituted by a plurality of capacitors are arranged inside the resin-molding case 12. In this first embodiment, each capacitor in the capacitor cell CDS is a film capacitor obtained through the steps of winding a film which is coated with a metal by vapor deposition, and forming electrodes 11 on opposite surfaces of the wound film in its axial direction by metal spraying. Thus, in the capacitor used in this first embodiment, the electrodes 11 are positioned on both the side surfaces in opposed relation.

The laminate of the wide conductor 8, the insulation sheet 10, and the wide conductor 9 is arranged under the capacitor cells CDSs.

The wide conductor 8 has an area allowing the plurality of capacitor cells CDSs to be all supported on it. In other words, when the plurality of capacitor cells CDSs each having a cylindrical shape are placed side by side on the wide conductor 8, the wide conductor 8 is formed of a conductor with a width larger than the total width of a capacitor assembly in its longitudinal direction. Raised lugs 14 for connection to the electrodes 11 of the capacitor cells CDSs are formed on an upper surface of the wide conductor 8. As shown in FIG. 5, by way of example, when six capacitor cells CDSs are used, six raised lugs 14 are formed. Further, the raised lugs 14 are arranged, as shown, such that a raised lug 14-A connected to a capacitor cell CDS-A in the most front side as viewed on the drawing sheet is positioned to be capable of being connected to the electrode 11 at the left side, as viewed on the drawing sheet, of the capacitor cell CDS-A and a raised lug 14-B connected to a capacitor cell CDS-B in the second most front side as viewed on the drawing sheet is positioned to be capable of being connected to the electrode 11 at the right side, as viewed on the drawing sheet, of the capacitor cell CDS-B. Thus, the raised lugs 14 are arranged in a zigzag pattern.

Similarly to the wide conductor 8, the wide conductor 9 also has an area allowing the plurality of capacitor cells CDSs to be all supported on it. In other words, when the plurality of capacitor cells CDSs each having a cylindrical shape are placed side by side on the wide conductor 9, the wide conductor 9 is formed of a conductor with a width larger than the total width of a capacitor assembly in its longitudinal direction. Similarly to the raised lugs 14, raised lugs 15 for connection to the electrodes 11 of the capacitor cells CDSs are formed on an upper surface of the wide conductor 9. In a state where the wide conductors 8 and 9 are joined in the layered form, the raised lugs 15 penetrate through-holes 16 formed in the wide conductor 8 and project above the wide conductor 8. As shown in FIG. 5, by way of example, when six capacitor cells CDSs are used, six raised lugs 15 are formed as with the raised lugs 14. Further, the raised lugs 15 are arranged, as shown, such that a raised lug 15-A connected to the capacitor cell CDS-A in the most front side is positioned to be capable of being connected to the electrode 11 at the right side of the capacitor cell CDS-A and a raised lug 15-B connected to the capacitor cell CDS-B in the second most front side is positioned to be capable of being connected to the electrode 11 at the left side of the capacitor cell CDS-B. Thus, the raised lugs 15 are also arranged in a zigzag pattern. Accordingly, looking at one capacitor cell CDS, the raised lug 14 of the wide conductor 8 is connected to the electrode 11 on one end surface thereof, and the raised lug 15 of the wide conductor 9 is connected to the electrode 11 on the other end surface thereof. The plurality of capacitor cells CDSs constituting the capacitor module CM are connected in parallel with respect to the wide conductor 8 and the wide conductor 9. The wide conductors 8, 9 and the side-surface electrodes 11 of the capacitor cells CDSs are electrically connected to each other by, e.g., a solder.

The raised lugs 14 and 15 serving as connecting terminals of the capacitor cells CDSs are formed by cutting parts of the wide conductors 8 and 9 and raising the cut parts three-dimensionally (perpendicularly) with respect to the wide conductor surfaces. With the provision of the raised lugs 14 and 15, the capacitor cells CDSs and the wide conductors 8, 9 can be connected to each other without using any additional connecting members, and the number of points to be soldered can be reduced, thus resulting in a reduction of the number of steps and the cost. In addition, it is possible to improve reliability of the connecting portions, to reduce electrical resistance thereof, and to increase heat radiation.

The layered wide conductors 8 and 9 are each made of a copper-base material having low resistance and high thermal conductivity. When a reduction in weight is demanded, an aluminum-base material is used. Soldering of the aluminum-base material is enabled by plating nickel or like on the surface of the aluminum-base material. Each of the wide conductors 8 and 9 has a thickness of 1 mm.

The insulation sheet 10 is preferably as thin as possible. When the environment temperature inside the power converter is 120° C. at maximum, the insulation sheet 10 is formed of a sheet of polypropylene (PP) or polyethylene (PET) which has a thickness of not larger than 1 mm, e.g., about 0.2 mm or 0.4 mm, which can be easily deformed into a desired shape, and which has good adhesion to the molded resin. The thinner the insulation sheet 10, the smaller is inductance because the wide conductors 8 and 9 can be more closely positioned to each other in the layered form. When the power converter INV has a small current capacity, the layered wide conductors 8 and 9 may be modified such that metals are printed on both sides of the insulation sheet 10 and the printed metals are used as wide conductors. In that case, another connecting conductor is separately prepared for connection.

Figure 4:
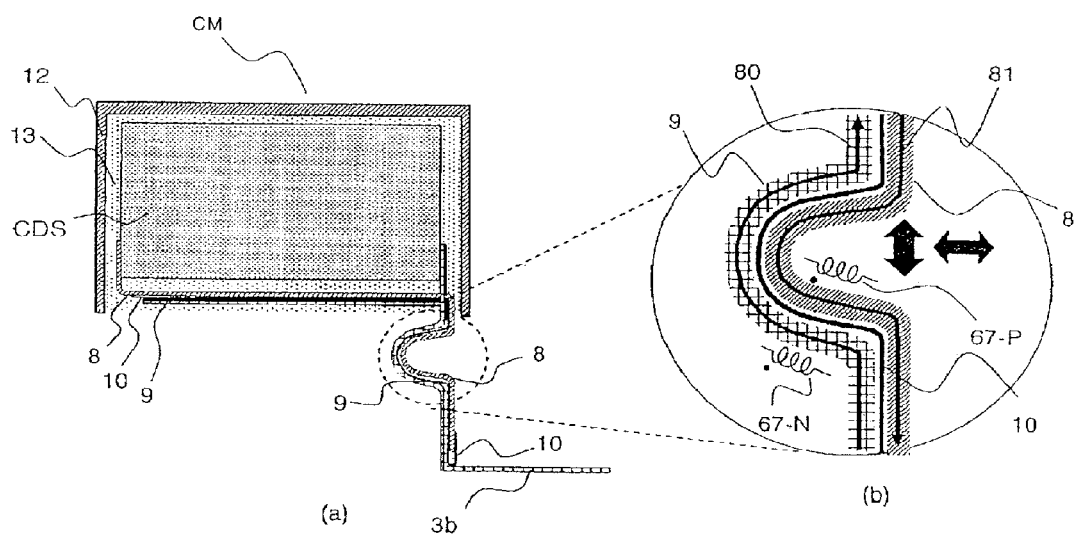
FIGS. 4A and 4B are respectively a sectional view and a partial enlarged view of the capacitor module according to the first embodiment of the present invention.

Each of the wide conductors 8 and 9 has a first flat portion on which is supported the capacitor cells CDSs, and a second flat portion bent perpendicularly to the first flat portion. Near centers of the second flat portions of the wide conductors 8 and 9, as shown in FIG. 4, U-shaped bent portions 8c and 9c are formed to extend in the longitudinal direction of the second flat portion. The bent portions 8c and 9c serve to moderate stresses caused in the connecting portions. Each of the bent portions is not limited in shape to a U-bent form and may be of a structure having any of other suitable shapes, such as a V-bent form, so long as it is able to moderate stresses applied to the connecting portions.

Figure 6:
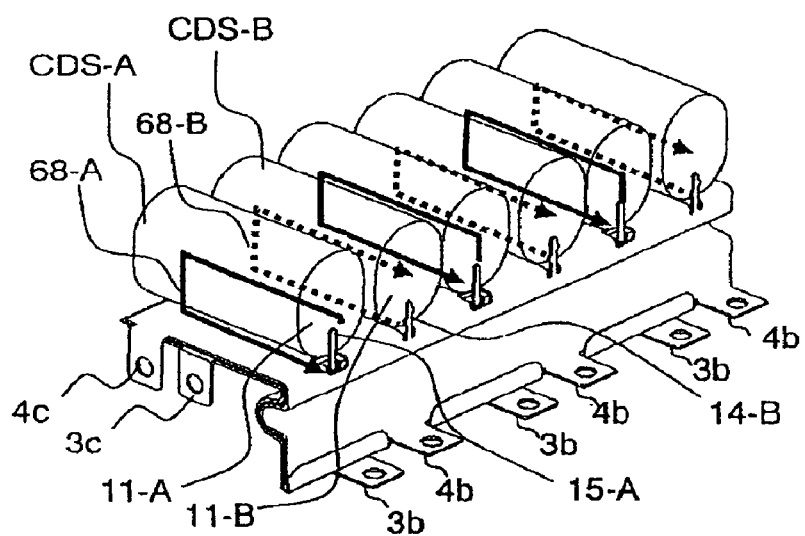
FIG. 6 is a perspective view of a principal part of the capacitor module according to the first embodiment of the present invention, the view including arrows for explaining current paths.

FIG. 6 is a perspective view of a principal part of the capacitor module according to the first embodiment of the present invention, the view including arrows for explaining current paths One connecting portion 4c and three connecting portions 4b are formed at the end of the wide conductor 8. Also, one connecting portion 3c and three connecting portions 3b are formed at the end of the wide conductor 9. The connecting portions 3c and 4c are used for connection of cables and a bus bar extended from the high-voltage battery BAT. The connecting portions 3b and 4b are used for connection to the U-phase arm, the V-phase arm, and the W-phase arm of the power module, respectively.

In the connecting portions 3b and 4b, screws are inserted from above and fastened. Taking into account the necessity of such a screwing operation, the bent portions 8c and 9c are formed to project from the second flat portion in a direction reversal to the direction in which the connecting portions 3b and 4b are projected.

FIG. 6 shows a state where the capacitor cells CDSs are fixedly connected onto the laminate of the wide conductor 8, the insulation sheet 10, and the wide conductor 9. The raised lug 15-A of the wide conductor 9 is connected to the electrode 11-A on the right side surface of the capacitor cell CDS-A, and the raised lug 14-B of the wide conductor 8 is connected to the electrode 11-B on the right side surface of the capacitor cell CDS-B.

By arranging and connecting the capacitor cells CDSs as described above, currents are caused to flow through the laminate in directions canceling each other and a low inductance can be realized.

Let here look at currents flowing through the capacitor cells CDS-A and CDS-B, for example.

The current flowing through the capacitor cell CDS-A is indicated by 68-A, and the current flowing through the capacitor cell CDS-B is indicated by 68-B. Those two currents flow counterclockwise and clockwise as viewed on the drawing sheet, respectively, i.e., in opposed directions.

Figure 7:
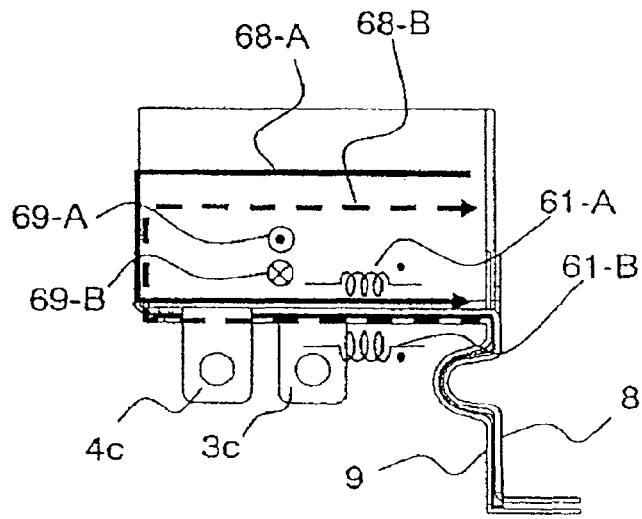
FIG. 7 is a side view of a principal part of the capacitor module according to the first embodiment of the present invention, the view including arrows for explaining current paths.

FIG. 7 is a side view of a principal part of the capacitor module according to the first embodiment of the present invention, the view including arrows for explaining current paths.

The currents 68-A and 68-B shown in FIG. 6 also flow through the wide conductors 8 and 9 in opposed directions. More specifically, the currents 68-A and 68-B flow through an inductance 61-A of the wide conductor 8 and an inductance 61-B of the wide conductor 9, which are positioned just under the capacitor cells CDSs, in opposed directions. Therefore, a low inductance is realized based on inductance coupling.

Further, magnetic fluxes produced by the currents 68-A and 68-B induce currents 69-A and 69-B which flow in a direction coming out from the drawing sheet and in a direction going into the drawing sheet, respectively. Thus, the currents 69-A and 69-B are canceled each other and a low inductance is realized from this point of view as well.

Figure 8:
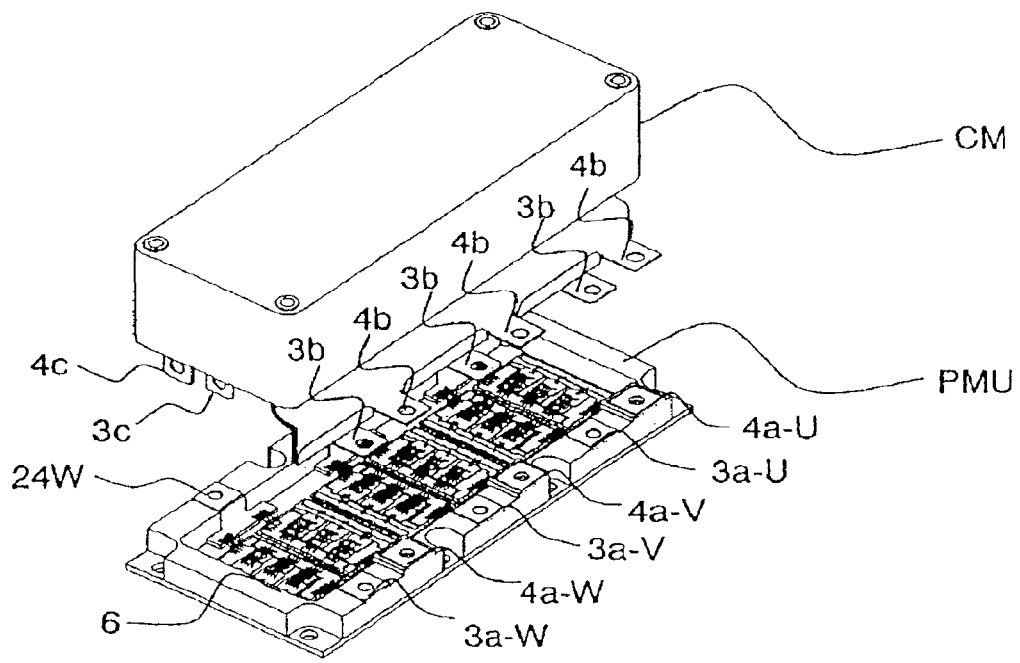
FIG. 8 is an exploded perspective view showing the connection between the capacitor module CM and a power module PMU of the power converter INV according to the first embodiment of the present invention.

FIG. 8 is an exploded perspective view showing the connection between the capacitor module CM and the power module PMU of the power converter INV according to the first embodiment of the present invention.

The capacitor module CM shown in the upper side of FIG. 8 is the same as that described above with reference to FIGS. 3-7. The power module PMU is arranged under the capacitor module CM. The power module PMU has the U-phase arm, the V-phase arm, and the W-phase arm, which have electrodes (4a-U, 3a-U, 4a-V, 3a-V, 4a-W and 3a-W) formed at their opposite ends. Corresponding to such an arrangement, the capacitor module CM of this first embodiment has three pairs of connecting portions 4b and 3b.

Through-holes capable of receiving screws are formed in the connecting portions 3b and 4b of the capacitor module CM, and those holes are positioned in match with the connecting portions 3a and 4a of the power module PMU such that both the modules are electrically and mechanically connected to each other by using screws. Note that the number of the connecting portions of the capacitor module CM is of course not limited to three pairs and can be changed depending on the number of the connecting portions of the power module PMU.

Figure 9:
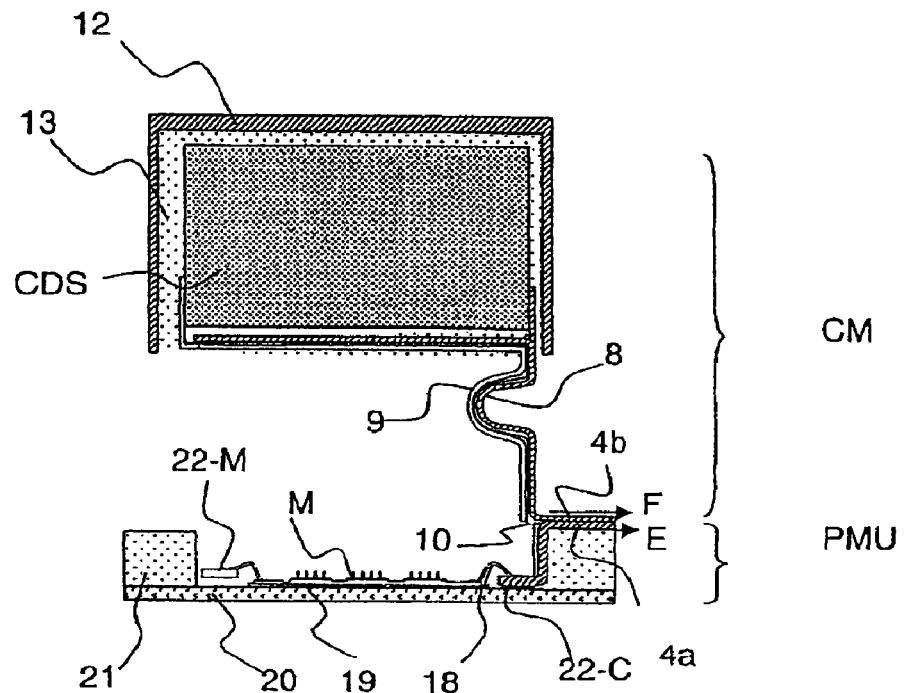
FIG. 9 is a sectional view showing the connection between the capacitor module CM and the power module PMU of the power converter INV according to the first embodiment of the present invention.

FIG. 9 is a sectional view showing the connection between the capacitor module CM and the power module PMU of the power converter INV according to the first embodiment of the present invention.

Figure 10:
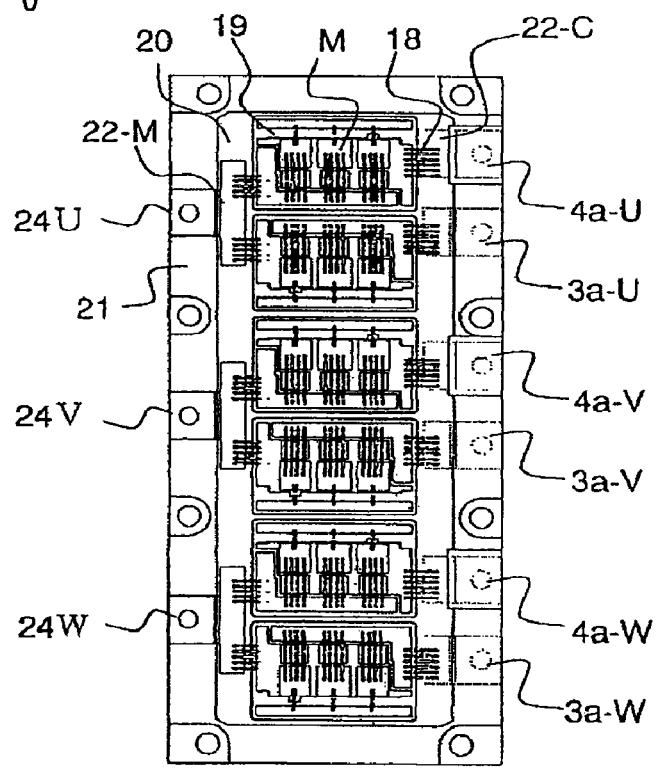
FIG. 10 is a plan view of the power module PMU used in the power converter INV according to the first embodiment of the present invention.

FIG. 10 is a plan view of the power module PMU used in the power converter INV according to the first embodiment of the present invention.

As shown in FIGS. 9 and 10, the power module PMU includes a copper base 20 for cooling, a case 21 bonded to an upper surface of the copper base 20 in its outer peripheral portion, an insulating substrate 19 soldered to the upper surface of the copper base 20 near its center, IGBTs (M) and diodes soldered onto circuit patterns of the insulating substrate 19, and external connecting conductors 22 withdrawn from the interior of the case 21 to the exterior. External connecting conductors 22-C constitute six electrodes at the opposite ends of the U-phase arm, the V-phase arm, and the W-phase arm, and their ends serve as the connecting portions (4a-U, 3a-U, 4a-V, 3a-V, 4a-W and 3a-W) for connection to the capacitor module CM. Also, external connecting conductors 22-M constitute electrodes for outputting a three-phase voltage at midpoints of the U-phase arm, the V-phase arm, and the W-phase arm, and their ends serve as the connecting portions (24U, 24V and 24W) for outputting a three-phase AC current to the motor MG1. Electrical connections between the IGBTs (M) and diodes and the external connecting conductors 22-C, between the external connecting conductors 22-M for outputting the three-phase voltage and the circuit patterns on the insulating substrate, and between the circuit patterns on the insulating substrate are established by a plurality of aluminum wires 18.

In the power module PMU of this first embodiment, the upper arm and the lower arm for each phase are constituted by connecting three pairs of power semiconductor devices IGBTs and diodes in parallel. However, the power module PMU is of course not limited to that arrangement, and the dimension and number of the devices can be of course changed depending on the current capacity. Also, while this first embodiment employs a single 6-in-1-module for providing a three-phase output by one module, three 2-in-1-modules each providing a one-phase output by one module may be arranged side by side. Note that since this embodiment is described in connection with the connecting portions between the capacitor module CM and the power module PMU through which a large current flow, wirings for switching the power semiconductor devices (i.e., gate wirings), terminals accessible from the exterior, and wiring patterns are not shown in the drawings.

The connecting structure between the capacitor module CM and the power module PMU according to this first embodiment will be described below.

As shown in FIG. 9, a direction in which the connecting portions 3a and 4a of the power module PMU are extended after being bent (i.e., a direction indicated by E in FIG. 9) and a direction in which the connecting portions 3b and 4b of the capacitor module CM are extended after being bent (i.e., a direction indicated by F in FIG. 9) are set to be the same.

Figure 11:
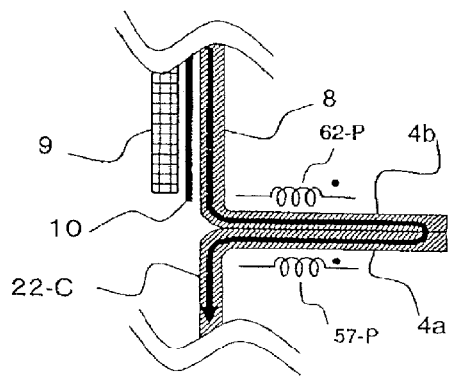
FIG. 11 is an enlarged sectional view of a connecting portion between the capacitor module CM and the power module PMU according to the first embodiment of the present invention, the view including an arrow for explaining a current path.

FIG. 11 is an enlarged sectional view of the connecting portion between the capacitor module CM and the power module PMU according to the first embodiment of the present invention, the view including an arrow for explaining a current path.

As shown in FIG. 11, the current in the wide conductor 8 flows through the connecting portions 4b and 4a as indicated by an arrow 22-C. Looking at the current flowing through each of the connecting portions 4b and 4a, the directions of those currents are opposed to each other, i.e., in canceling relation. Stated another way, the currents in the opposed directions flow through an inductance 62-P in the connecting portion 4b of the capacitor module CM and an inductance 57-P in the connecting portion 4a of the power module PMU, whereby a low inductance is realized based on inductance coupling.

The above-mentioned three kinds of inductance reducing effects will be described below together with reference to a circuit diagram.

Figure 12:
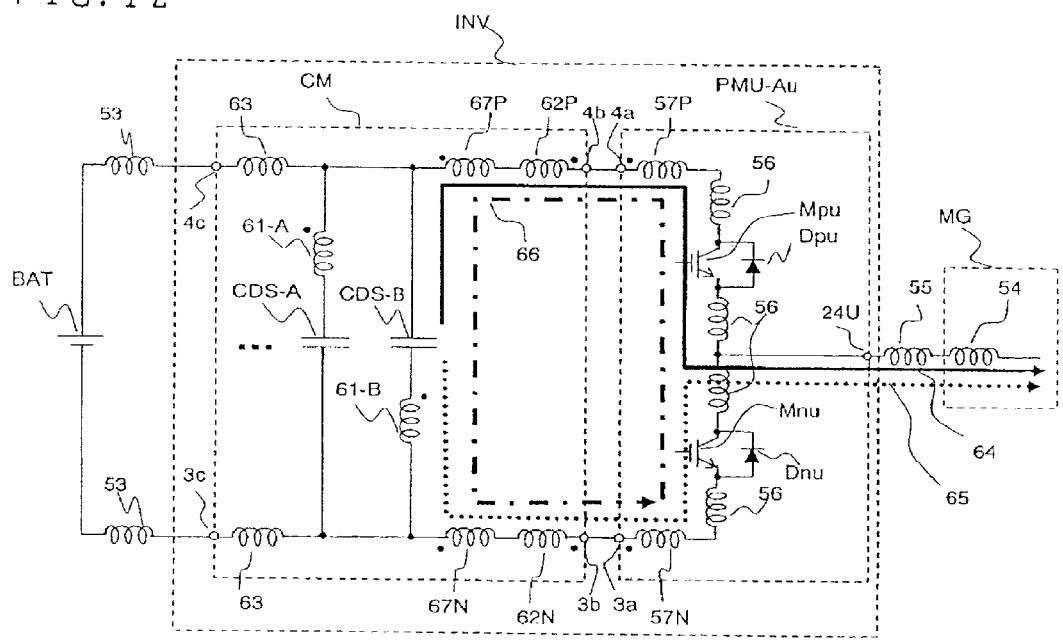
FIG. 12 is an inductance circuit diagram of the power converter INV according to the first embodiment of the present invention.

FIG. 12 is an inductance circuit diagram of the power converter INV according to the first embodiment of the present invention.

For the purpose of explaining an abruptly changed current and a voltage caused by the current, the following description is made of primarily inductance components while resistance components are omitted. Also, for the power module PMU, only one arm (Au) of U-phase is described and the power semiconductor devices Mpu and Dpu of the upper arm and the lower arm are represented by one device.

In FIG. 12, the same characters represent parasitic inductances in the same parts as those in FIGS. 4, 7 and 11.

A parasitic inductance 53 represents the inductance of cables and a bus bar which connect the high-voltage battery BAT and the power converter INV to each other.

A parasitic inductance 55 represents the inductance of cables and a bus bar which connect the power converter INV and the motor MG1 to each other.

A parasitic inductance 54 represents the inductance of a part of the field winding of the motor MG1.

The power module PMU has not only an inner parasitic inductance 56, but also parasitic inductances 57-P and 57-N produced in the connecting portions to the power supply on the higher potential side and the lower potential side due to the necessity of securing a certain insulation distance.

The capacitor module CM has parasitic inductances 61-A and 61-B in the plurality of the capacitor cells CDS-A, CDS-B for supplying and absorbing electric power momentarily and the wide conductors on which are supported those capacitor cells CDSs, parasitic inductances 67-P and 67-N in the layered wide conductors positioned outside the molded resin, and parasitic inductances 62-P and 62-N in the connecting portions thereof. Note that only two capacitor cells CDS-A and CDS-B are illustrated herein.

Let now consider a current change caused when the power semiconductor device Mpu in the upper arm of the power module PMU is turned off from the on-state. A path through which a current flows upon the power semiconductor device Mpu in the upper arm being turned on is indicated by a current path 64. Because the inductances 54 and 55 are large, a current flowing through those inductances cannot be quickly changed at the time of switching. In that turning-off state, therefore, a current path 65 passing the power semiconductor device Dnu in the lower arm is established. Thus, looking at a circuit in which a current has been abruptly changed, it is equivalently regarded that the current flows through a current path 66. By reducing the parasitic inductance present in a closed circuit formed by the current path 66, it is possible to reduce the jumping voltage at the time of switching, and to suppress heating of the power semiconductor device caused by speedup of the switching. The above description is made in connection with the switching at which the power semiconductor device Mpu in the upper arm is turned off from the on-state. Conversely, when the power semiconductor device Mpu in the upper arm is turned on from the off-state, the power semiconductor device Mnu in the lower arm is turned off from the on-state and therefore the current also flows through the current path 66 although the direction of the current is reversed. Further, it is similarly understood that, at the time of switching of the power semiconductor device Mnu in the lower arm, the current flows through the current path 66 in either the same direction or the reversed direction.

The first inductance-reducing effect is obtained by the bent structure of the laminate shown in FIG. 4B.

Stresses applied to the connecting portions are moderated by the presence of the bent structure. Further, in the bent structure, since the currents flow through the wide conductors 8 and 9 of the laminate in the opposed directions, inductance coupling is caused between the inductances 67-P and 67-N so as to reduce a total inductance. In other words, the parasitic inductances 67-P and 67-N in FIG. 12 are coupled to each other, thus resulting in a small inductance.

The second inductance-reducing effect is obtained by the zigzag connection of the capacitor cells CDSs and the layered wide conductors 8, 9 shown in FIG. 7.

As shown in FIG. 7, the currents 68-A and 68-B flowing through the wide conductors 8 and 9 on which are supported the capacitor cells CDS-A and CDS-B are opposed in direction. Thus, since the currents 68-A and 68-B flow in the opposed directions through the inductance 61-A of the wide conductor 8 and the inductance 61-B of the wide conductor 9 which are positioned just under the capacitor cells CDS-A and CDS-B, respectively, a low inductance is realized based on inductance coupling. In other words, the parasitic inductances 61-A and 61-B shown in FIG. 12 are coupled to each other, thus resulting in a low inductance.

The third inductance-reducing effect is obtained by the connection structure between the capacitor module CM and the power module PMU shown in FIG. 11.

As shown in FIG. 11, the currents flow through the connecting portion 4b of the capacitor module CM and the connecting portion 4a of the power module PMU in the opposed directions canceling each other. Therefore, the inductance 62-P in the connecting portion 4b of the capacitor module CM and the inductance 57-N in the connecting portion 4a of the power module PMU are coupled to each other, thus resulting in a low inductance.

As a result, in addition to the moderation of stresses in the connecting portions, a low inductance of the current path 66 in FIG. 12 can also be realized based on the above-mentioned three inductance-reducing effects by using the capacitor module CM of this first embodiment.

In the past, in an environment of severe temperature difference within an inverter for the HEV and an environment of severe vibration encountered when the HEV is driven over a road block or other level differences in roads, the conventional heavy capacitors cannot be connected in proximity relation. To prevent rupture in an electrical connecting portion, therefore, a third connecting conductor is often disposed between a capacitor module and a power semiconductor module; namely, another low-inductance connecting conductor is often used between the capacitor module CM and the power module PMU. In such a case, two connecting points are required between the capacitor module and the connecting conductor and between the connecting conductor and the power module. An increase in the number of the connecting points increases inductance for the reason that the conductors are brought into an exposed state due to the necessity of access from the exterior, such as screwing, and a certain insulation distance is required.

In this first embodiment, since the bent structure is formed in the laminate extending from the capacitor module CM to realize direct connection between the capacitor module CM and the power module PMU, stresses are moderated and inductance is reduced with a reduction in the number of the connecting points. Assuming, for example, that the insulation distance of 8 mm is required in terms of the creeping distance in the connecting portion to the power supply with a withstand voltage of 600 V, elimination of one connecting point can reduce inductance of 8 nH because a distance of 1 mm corresponds to an inductance increase of about 1 nH.

The construction of a capacitor module CM and a power converter INV according to a second embodiment of the present invention will be described below with reference to FIGS. 13-20.

This second embodiment enables, in the motor system shown in FIG. 1, the power converter INV for controlling two motors MG1 and MG2 to be realized with a low inductance, a stress moderating structure and a smaller size.

Figure 13:
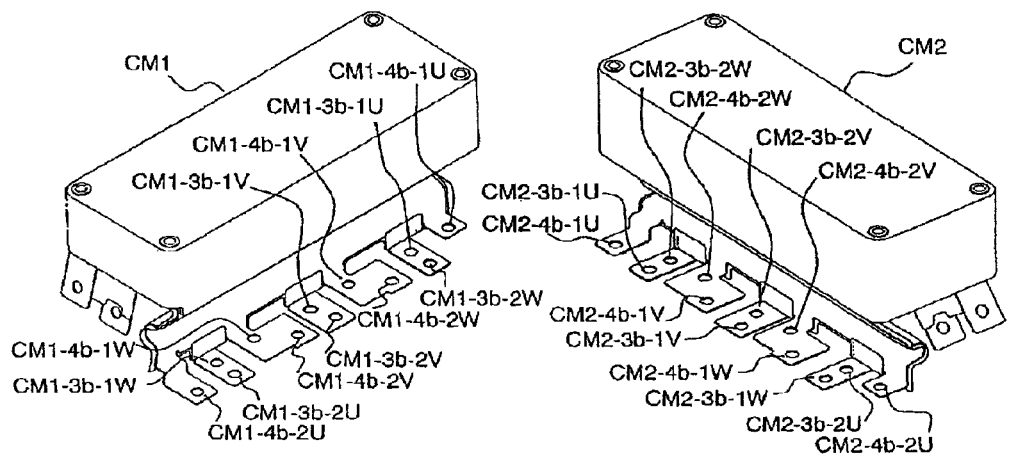
FIG. 13 is a perspective view showing an external appearance of a capacitor module CM according to a second embodiment of the present invention.
Figure 14:
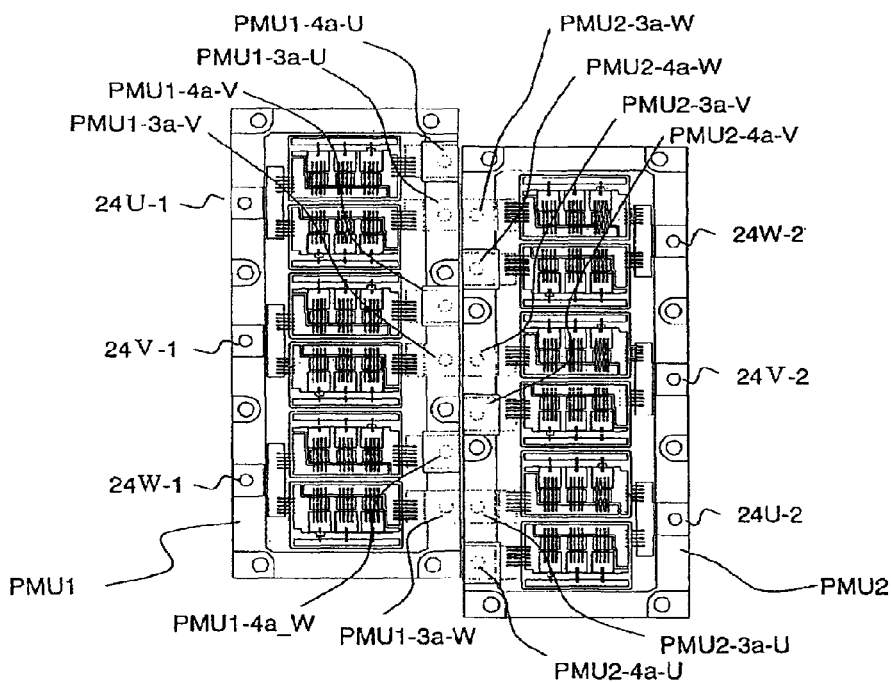
FIG. 14 is a plan view showing the arrangement of each power module PMU of a power converter INV according to the second embodiment of the present invention.
Figure 17A:
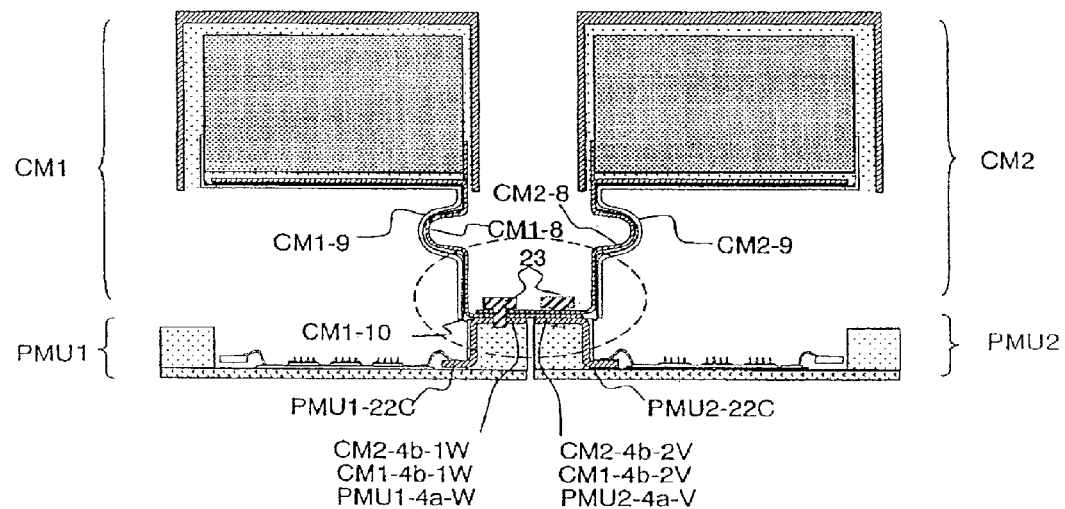
FIGS. 17A and 17B are each a sectional view and an enlarged view showing the connection between the capacitor module CM and the power module PMU of the power converter INV according to the second embodiment of the present invention.
Figure 17B:
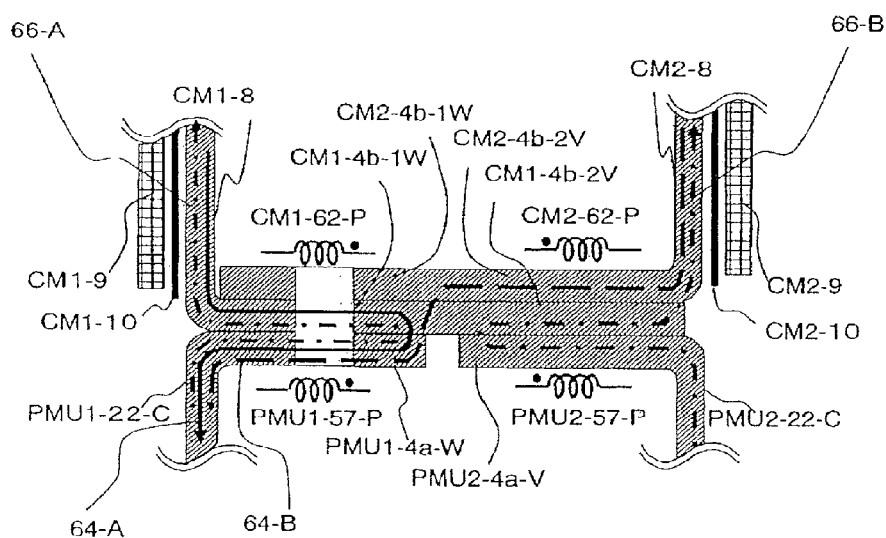
Figure 18:
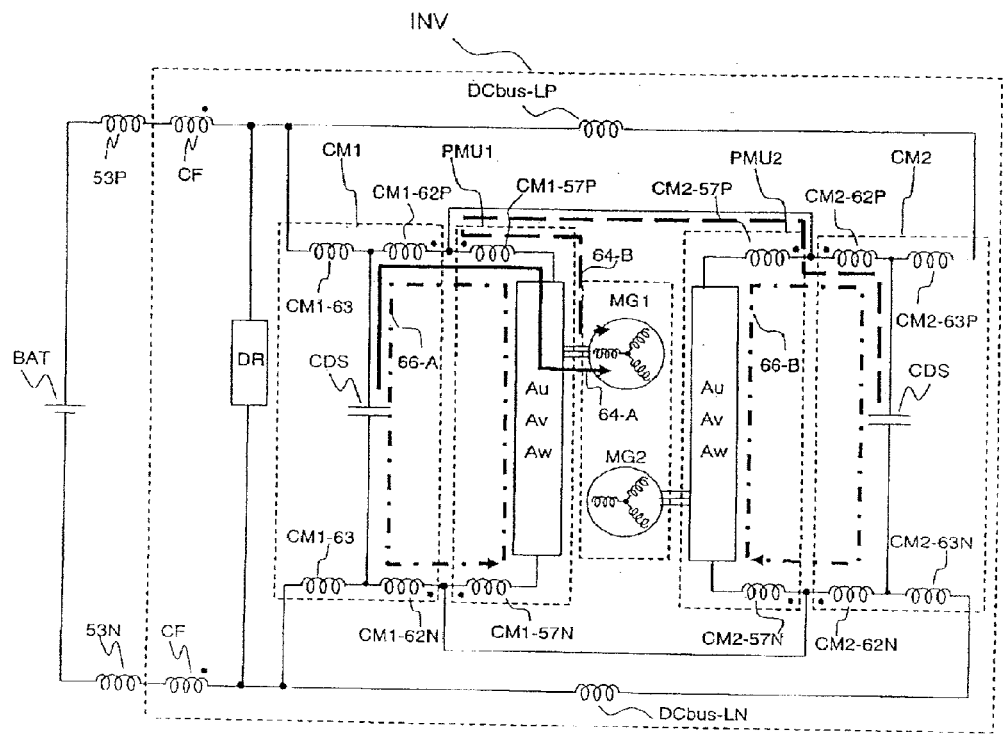
FIG. 18 is a circuit diagram of the power converter INV according to the second embodiment of the present invention.

FIG. 13 is a perspective view showing the construction of each capacitor module according to the second embodiment of the present invention. FIG. 14 is a plan view showing the arrangement of each power module according to the second embodiment of the present invention. FIGS. 17A and 17B are each a sectional view showing the power converter according to the second embodiment of the present invention. FIG. 18 is a circuit diagram showing the entire construction of the power converter INV according to the second embodiment of the present invention. Note that, in those drawings, the same characters as those in FIG. 4-14 denote the same parts.

A basic construction of each capacitor module CM1, CM2 is the same as that of the capacitor module CM shown in FIGS. 4-12. This second embodiment is featured in the following point. As shown in FIG. 13, one capacitor module CM1 has connecting holes enabling two power modules PMU1 and PMU2 to be mounted to the capacitor module CM1, and the other capacitor module CM2 paring with the capacitor module CM1 also has connecting holes enabling the two power modules PMU1 and PMU2 to be mounted to the capacitor module CM2. Further, hole positions in the connecting portions between the capacitor module CM1 and the two power modules PMU1, PMU2 and hole positions in the connecting portions between the capacitor module CM2 and the two power modules PMU1, PMU2 are matched with each other such that those components can be jointly connected together by screwing. In other words, each capacitor module CM1, CM2 has the connecting holes in number twice the number of the connecting holes formed in the capacitor module CM shown in FIG. 4.

FIG. 14 shows the arrangement of each power module PMU of the power converter INV according to the second embodiment of the present invention. The two power modules PMU1 and PMU2 have the same structure as that shown in FIG. 10. Those power modules PMU1 and PMU2 are arranged side by side on a plane such that the connecting portions for the capacitor modules having the same polarity are close to each other. More specifically, a W-phase negative connecting portion PMU1-3*a*-W of the power module PMU1 and a U-phase negative connecting portion PMU2-3*a*-U of the power module PMU2 are positioned close to each other, and a W-phase positive connecting portion PMU1-4-*a*-W of the power module PMU1 and a V-phase positive connecting portion PMU2-4*a*-V of the power module PMU2 are positioned close to each other. Thus, the connecting portions of the two power modules are positioned close to each other per each of positive pole and negative pole. Because of the power modules PMU1 and PMU2 having the same construction, when the connecting portions for the capacitor modules are arranged in oppositely facing relation such that the poles having the same polarity are close to each other, a U-phase positive connecting portion PMU2-4*a*-U of the power module PMU2 and a U-phase positive connecting portion PMU1-4*a*-U of the power module PMU1 are each positioned without oppositely facing the electrode of the power module on the opposite side. Accordingly, in the connecting portions of each of the capacitor modules CM1 and CM2 for connection to the power modules, the number of positive poles is larger than the number of negative poles by one, as shown in FIG. 13.

Figure 15:
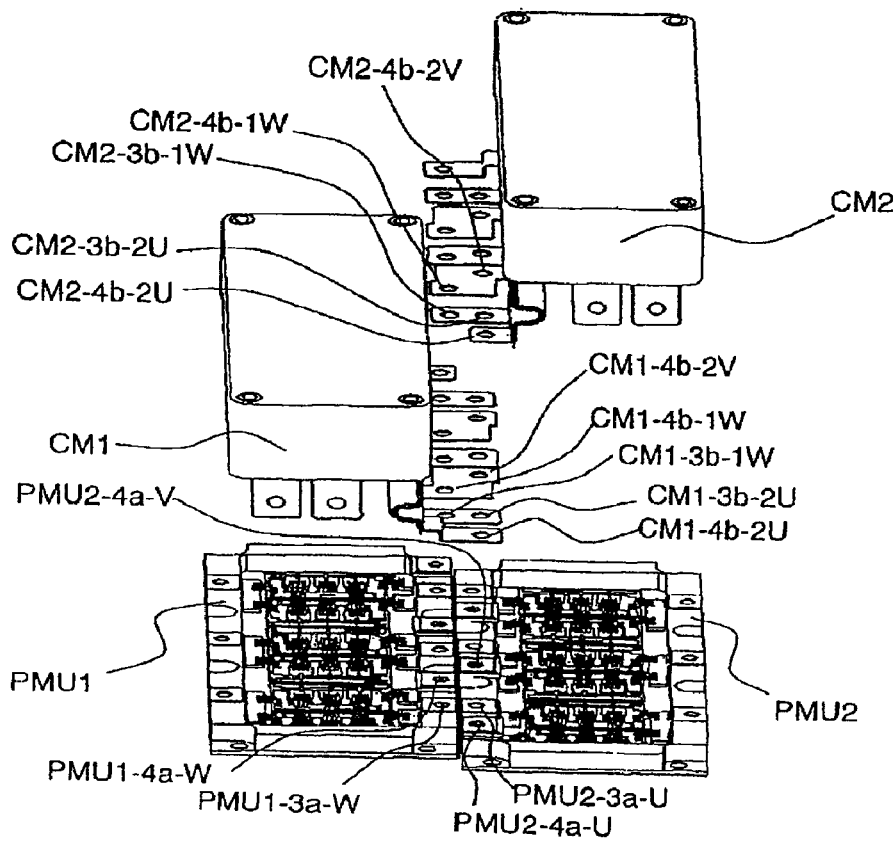
FIG. 15 is an exploded view showing the connection between the capacitor module CM and the power module PMU of the power converter INV according to the second embodiment of the present invention.

FIG. 15 is an exploded view showing the connection between the capacitor module CM and the power module PMU of the power converter INV according to the second embodiment of the present invention.

As shown in FIG. 15, the capacitor modules CM1 and CM2 are connected respectively to the two power modules PMU1 and PMU2, of which connecting portions for the capacitor modules are arranged in oppositely facing relation to the connecting portions of the capacitor modules, by screwing the oppositely-facing connecting portions from above and jointly fastening them together. More specifically, the connecting portion CM2-4*b*-2U of the capacitor module CM2, the connecting portion CM1-4*b*-2U of the capacitor module CM1, and the connecting portion PMU2-4*a*-U of the power module PMU2 are jointly connected together by one screw. Likewise, the other connecting portions also connected such that CM2-3*b*-2U, CM1-3*b*-2U and PMU2-3*a*-U are jointly connected together by one screw, CM2-3*b*-1W, CM1-3*b*-1W and PMU1-3*a*-W are jointly connected together by one screw, CM2-4*b*-1W, CM1-4*b*-1W and PMU1-4*a*-W are jointly connected together by one screw, CM2-4*b*-2V, CM1-4*b*-2V and PMU2-4*b*-V are jointly connected together by one screw, and so on.

Figure 16:
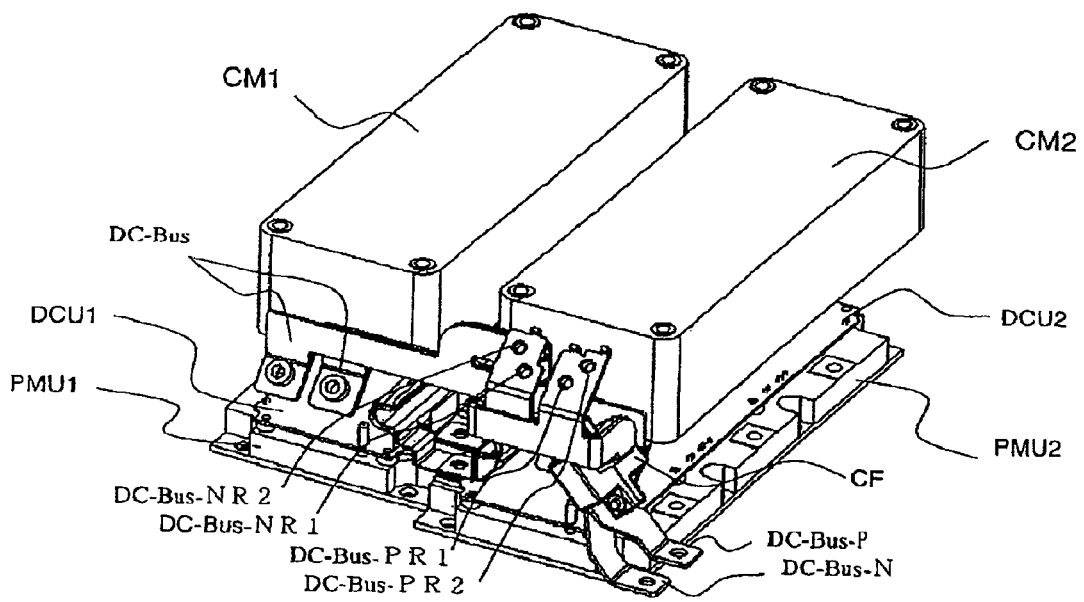
FIG. 16 is a perspective view showing a state where the capacitor module CM and the power module PMU of the power converter INV according to the second embodiment of the present invention are assembled with a driving circuit unit DCU and a DC bus bar.

FIG. 16 is a perspective view showing a state where the capacitor module CM and the power module PMU of the power converter INV according to the second embodiment of the present invention are assembled with a driving circuit unit DCU and a DC bus bar.

Two driving circuit units DCU1 and DCU2 are arranged on the two power modules PMU1 and PMU2, and the two capacitor modules CM1 and CM2 are connected onto the driving circuit units DCU1 and DCU2, respectively. The two capacitor modules CM1 and CM2 are connected to each other by a DC bus bar DC-Bus for applying the voltage of the high-voltage battery BAT. The DC bus bar DC-Bus is formed by partly overlapping two kinds of conductors on the high potential side (positive side) and the low potential side (negative side) in a layered form with an insulation sheet (not shown) being interposed between them, and it has connecting portions DC-Bus-P and DC-Bus-N for connection to the high-voltage battery BAT. To prevent noise from spreading to the exterior, common mode choke filters CF are further mounted between the capacitor modules CM1, CM2 and the connecting portions DC-Bus-P and DC-Bus-N, respectively. In addition, there are disposed a resistance for urgent discharge from the capacitor modules CM1 and CM2 when the operation of the HEV is stopped, and connecting portions DC-Bus-PR1, DC-Bus-NR1, DC-Bus-PR2, and DC-Bus-NR2 for connection of natural discharge resistances.

FIGS. 17A and 17B are each a sectional view showing the connection between the capacitor module CM and the power module PMU of the power converter INV according to the second embodiment of the present invention. The sections shown in FIGS. 17A and 17B represent the position where the connecting portions PMU1-4*a*-W and PMU2-4*a*-V of the power modules PMU1 and PMU2 are close to each other.

The two capacitor modules CM1 and CM2 and the two power modules PMU1 and PMU2 are electrically connected to each other by two screws 23. With that connection, one capacitor module is connected onto one power module, while ensuring a low inductance, in one pair of the power module PMU1 and the capacitor module CM1 and the other pair of the power module PMU2 and the capacitor module CM2.

More specifically, as shown in the enlarged view of FIG. 17B, a transient current 66-A generated upon a shift from the turning-on to -off at the time of switching of the power module PMU1 flows through the connecting portion CM1-4*b*-1W of the capacitor module CM1 and the connecting portion PMU1-4*a*-W of the power module PMU1 in opposed directions. Therefore, parasitic inductances CM1-62-P and PMU1-57-P in those connecting portions are coupled to each other and wiring with a low inductance can be realized. Also, a transient current 66-B generated upon a shift from the turning-on to -off at the time of switching of the power module PMU2 flows through the connecting portion CM2-4b-2V of the capacitor module CM2 and the connecting portion PMU2-4a-V of the power module PMU2 in opposed directions. Therefore, parasitic inductances CM2-62-P and PMU2-57-P in those connecting portions are coupled to each other and wiring with a low inductance can be realized.

Further, with the connection structure according to this second embodiment, even when the transient current generated upon a shift from the turning-on to -off at the time of switching of the power module PMU1 is going to flow from the connecting portion CM2-4b-2V of the capacitor module CM2 to the connecting portion PMU1-4a-W of the power module PMU1, the directions of the currents flowing through those connecting portions are not opposed to each other. Therefore, parasitic inductances CM2-62-P and PMU1-57-P in those connecting portions are not magnetically coupled to each other and wiring with a low inductance is not realized. Stated another way, the capacitor module CM2 has a larger parasitic inductance than the capacitor module CM1 with respect to the power module PMU1, and it exhibits a high impedance for a high-frequency current changed momentarily at the time of switching. As a result, the transient current generated upon a shift from the turning-on to -off at the time of switching of the power module PMU1 is suppressed from flowing into a low-inductance path formed by the power module PMU2 and the capacitor module CM2.

Likewise, a transient current generated upon a shift from the turning-on to -off at the time of switching of the power module PMU2 is also suppressed from flowing into a low-inductance path formed by the power module PMU1 and the capacitor module CM1.

Accordingly, even when the power modules PMU1 and PMU2 are subjected to the switching at the same time, it is possible to prevent an adverse effect that respective jumping voltages are summed to be doubled up to a level exceeding the withstand voltage of the power semiconductor device.

On the other hand, the capacitor module CM2 can be regarded as being connected to the power module PMU1 in parallel to the capacitor module CM1 for supply of a low-frequency current in the turned-on state after the switching. Thus, in the turned-on state, a low-frequency current can be supplied to the power module PMU1 as a current 64-A from the capacitor module CM1 and a current 64-B from the capacitor module CM2, as shown in the enlarged view of FIG. 17B.

Also, a low-frequency current can be similarly supplied to the power module PMU2 from both the capacitor modules CM1 and CM2.

As described above, each capacitor module serves as a proximal capacitor with low-inductance wiring, which reduces the jumping voltage, for the power module positioned just below the capacitor module, and also serves as a capacitor, which increases capacity, for the power module positioned below the capacitor module in obliquely adjacent relation. In a power converter having two power modules, therefore, there is no need of additionally arranging an extra capacitor for reducing the jumping voltage. Hence, in the motor system shown in FIG. 1, the power converter INV for controlling the two motors MG1 and MG2 can be realized in a smaller size by using the capacitor modules each having a low inductance and the stress moderating structure.

FIG. 18 is a circuit diagram of the power converter INV according to the second embodiment of the present invention.

Specifically, FIG. 18 shows a circuit diagram of the power converter INV, shown in FIGS. 15-17, which is constituted by the two power modules PMU1 and PMU2 and the two capacitor modules CM1 and CM2 for controlling the two motors MG1 and MG2.

In the following, parasitic inductances in the jointly-fastened connecting portions of the capacitor modules CM1 and CM2 and the power modules PMU1 and PMU2 are primarily described, while other parasitic inductances are omitted. In the circuit diagram, three-phase arms Au, Av and Aw contained in the power module and constituted by bridge circuits of power semiconductor devices are displayed in the form of a box. Further, control circuits, such as the driving circuit unit DCU, are not shown. Other identical characters to those in the foregoing drawings denote the same parts.

A voltage is applied from the high-voltage battery BAT to the capacitor modules CM1 and CM2 through the DC bus bar DC-bus shown in FIG. 16. Parasitic inductances DC-bus-LP and DC-bus-LN in the circuit diagram represent the parasitic inductances of the DC bus bar DC-bus on the higher potential side (positive side) and the lower potential side (negative side), respectively. The common mode choke filters CF for preventing noise are disposed in the DC bus bar between the capacitor modules CM1, CM2 and the input connecting portions DC-Bus-P and DC-Bus-N, respectively. In addition, a discharge resistance DR is disposed in the DC bus bar between the capacitor modules CM1, CM2 and the common mode choke filters CF.

In the connecting portions between the capacitor module CM1 and the power module PMU1, there are parasitic inductances CM1-62P and PMU1-57P on the higher potential side and parasitic inductances CM1-62N and PMU1-57N on the lower potential side, which are magnetically coupled to each other for each of the higher potential side and the lower potential side for the current 66-A flowing at the time of switching, thereby realizing wiring with a low inductance.

Also, in the connecting portions between the capacitor module CM2 and the power module PMU2, there are parasitic inductances CM2-62P and PMU2-57P on the higher potential side and parasitic inductances CM2-62N and PMU2-57N on the lower potential side, which are magnetically coupled to each other for each of the higher potential side and the lower potential side for the current 66-B flowing at the time of switching, thereby realizing wiring with a low inductance.

On the other hand, looking at a current path 64B bridging the jointly-fastened connecting portions of the two capacitor modules CM1 and CM2 and the two power modules PMU1 and PMU2, the parasitic inductances CM2-62P and PMU1-57P in those connecting portions on the higher potential side are not magnetically coupled to each other in the directions of the currents flowing through those connecting portions, whereby a low inductance is not resulted. That point is similarly applied to the bridging (jointly-fastened) connecting portions on the lower potential side. As a result, the transient currents 66-A and 66-B generated at the time of switching of the power modules PMU1 and PMU2 do not affect each other. For example, assuming the length of one connecting portion to be 15 mm, the total length of the two connecting portions on the higher potential side is 30 mm. Assuming an inductance per 1 mm to be 1 nH, the inductance on the higher potential side (positive side) is 30 nH. The total inductance on both the higher potential side (positive side) and the lower potential side (negative side) is 60 nH.

As compared with the inductances in the bridging connecting portions, the parasitic inductance in each of the capacitor modules CM1 and CM2 according to this second embodiment can be reduced by an order of magnitude. Therefore, the transient current (several gigas A/s) generated at the time of switching hardly flows through the bridging connecting portion. In other words, the current path 66-A at the time of switching of the power module PMU1 and the current path 66-B at the time of switching of the power module PMU2 are kept from interfering with each other. As a result, it is possible to prevent respective jumping voltages from being summed to be doubled up to a level exceeding the withstand voltage of the power semiconductor device.

On the other hand, for a current flowing through the motor MG1 and having low frequency f of about several hundreds Hz which is supplied in the turned-on state after the switching, the inductance L (e.g., 60 nH) in the bridging connecting portion appears as an impedance $Z=2\times\pi\times f\times L$, i.e., several $\mu\Omega$, and therefore it hardly gives resistance. Accordingly, the capacitor module CM2 can be regarded as being connected at a low impedance to the power module PMU1 in parallel as with the capacitor module CM1, and can supply a current. Thus, in the turned-on state, the low-frequency current can be supplied as the current 64-A from the capacitor module CM1 and the current 64-B from the capacitor module CM2.

Similarly, the low-frequency current can also be supplied to the power module PMU2 from both the capacitor modules CM1 and CM2.

Figure 19:
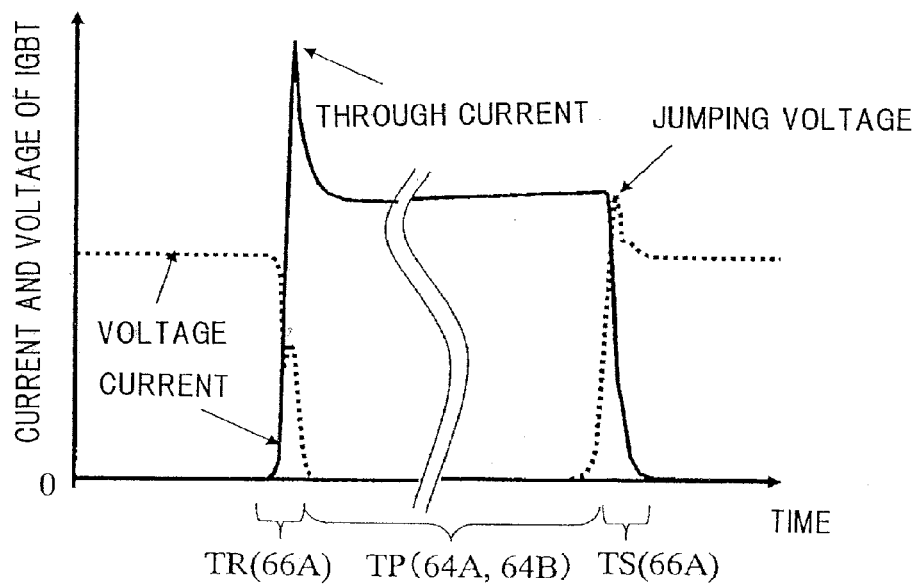
FIG. 19 is a graph roughly showing waveforms of a current and a voltage in one power semiconductor device IGBT of the power converter INV according to the second embodiment of the present invention.

FIG. 19 is a graph roughly showing waveforms of a current and a voltage in one power semiconductor device IGBT of the power converter INV according to the second embodiment of the present invention.

As shown in FIG. 19, the current waveform rises quickly (several gigas A/s) at on-switching. After an almost flat current (several hundreds Hz) flows for a period of several microseconds, the current waveform falls quickly (several gigas A/s) at off-switching.

The current appearing flat in FIG. 19 is in fact a low-frequency current of several hundreds Hz. Because FIG. 19 shows a span of several tens microseconds in enlarged scale, such a current seems flat.

The waveforms of FIG. 19 are assumed to represent the waveforms of the IGBT which constitutes the upper arm of the power module PMU1 in FIG. 18. In an on-switching period (TR) of the upper arm of the power module PMU1, the diode in the lower arm of the power module PMU1 is turned off and a high-frequency recovery current generated at the time of turning-off of the diode flows through the current path 66-A in the circuit diagram of FIG. 18. The generation of the recovery current causes a through current to flow in the IGBT at a level in excess of the current supplied. During the on-switching period (TR), the voltage of the upper arm IGBT is reduced to almost zero (in fact to several volts due to a conduction loss) during the on-switching period (TR). Meanwhile, the diode in the lower arm is turned off, whereupon a jumping voltage due to a recovery current caused at the turning-off of that diode occurs in the diode and the IGBT in the lower arm (waveforms of the current and the voltage in that diode being not shown). With the structure according to this second embodiment, however, since the current path 66-A is formed as a low-inductance circuit, the jumping voltage caused in the lower arm by the recovery current flowing through that diode can also be reduced.

During a period (TP) in which the upper arm is in the completely turned-on state, low-frequency currents flow from the capacitor modules CM1 and CM2 through the current paths 64-A and 64-B in the circuit diagram of FIG. 18. Because those currents have low frequency of about several hundreds Hz, the parasitic inductance (30 mH) in the connecting portions of the capacitor modules and the power modules cause no influence upon those low-frequency currents. Accordingly, the two capacitor modules CM1 and CM2 form a parallel circuit in which substantially no impedance is interposed between them, and the currents flow into the upper arm almost evenly from the two capacitor modules CM1 and CM2. Since the turned-on period (TP) is several tens microseconds and longer than the switching period (TR, TS) of shorter than 1 μs, heat generated from the capacitor modules CM1 and CM2 is decided depending on the amount of the currents flowing during the turned-on period (TP). Thus, with the currents almost evenly supplied from the two capacitor modules CM1 and CM2 during the turned-on period (TP), heat is also almost evenly generated from the two capacitor modules CM1 and CM2, whereby the useful life of each of the capacitor modules CM1 and CM2 is prolonged.

In an off-switching period (TS) of the upper arm, the current flowing in the power module PMU1 is quickly reduced to zero. As described above, therefore, a high-frequency current flows through the current path 66-A in the circuit diagram of FIG. 18. Accordingly, a jumping voltage in excess of the power supply voltage is caused in the upper arm due to such a current change, as indicated by the waveform in FIG. 19. With the structure according to this second embodiment, however, since the current path 66-A is formed as a low-inductance circuit, the voltage is hardly jumped up.

The overall construction of the power converter according to the second embodiment will be described below.

Figure 20:
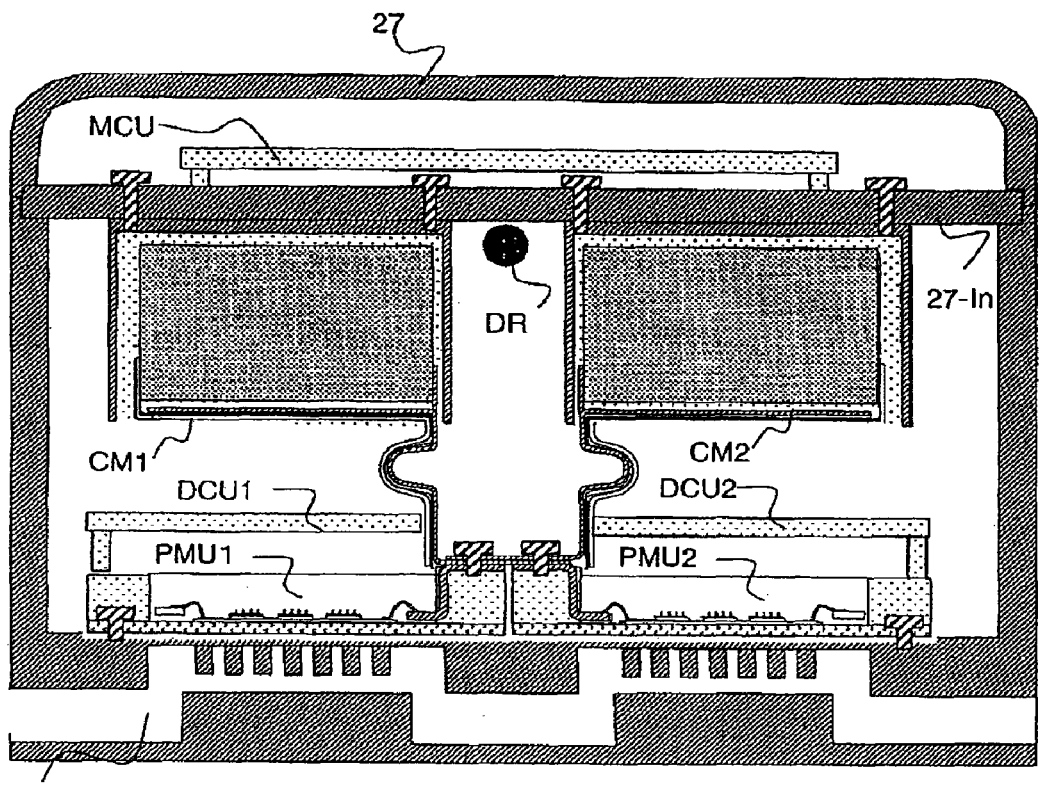
FIG. 20 is a sectional view showing the construction of the power converter INV according to the second embodiment of the present invention.

FIG. 20 is a sectional view showing the construction of the power converter INV according to the second embodiment of the present invention.

A housing 27 of the power converter INV is made of a material having good thermal conductivity and being light, e.g., aluminum, and it has a cooling water channel 28 which is formed at a bottom surface of the housing 27 to cool the whole of the housing 27 and to thermally insulate the housing interior from the temperature of an external atmosphere. The power modules PMU1 and PMU2 generating heat in largest amount with supply and switching of large currents are arranged nearest to the cooling channel 28 for effective cooling. The capacitor modules CM1 and CM2 are fixed to an inner housing 27-In of the power converter INV by fastening, e.g., screws through the fixing holes 17, shown in FIG. 3, such that upper surfaces of the capacitor modules CM1 and CM2 are contacted with a lower surface of the inner housing 27-In. With that structure, the heat generated from the capacitor modules CM1 and CM2 is transmitted to the inner housing 27-In and is released to a coolant through the housing 27 or radiated to the open air through the housing 27. The discharge resistance DR serving to discharge charges accumulated in the capacitor modules CM1 and CM2 is disposed between the capacitor modules CM1 and CM2 and is fixed to the inner housing 27-In in contact with the lower surface of the inner housing 27-In of the power converter INV. With that structure, during discharge, heat generated from the discharge resistance DR is transmitted to the inner housing 27-In and is released to the coolant through the housing 27 or radiated to the open air through the housing 27.

The driving circuit units DCU1 and DCU2 are arranged above the power modules PMU1 and PMU2 between the power modules PMU1, PMU2 and the capacitor modules CM1, CM2, respectively, and the motor control unit MCU is arranged on an upper surface of the inner housing 27-In.

The capacitor modules CM1 and CM2 can be fixed by a manner of forming threads in the fixing holes, or embedding screws in the molded resin so as to project from it. By thus cooling one surface of each of the resin-molded capacitor modules CM1 and CM2, it is possible to prevent a temperature rise of the capacitor cell CDS caused by the ripple current, and to prolong the useful life of the capacitor cell CDS.

While upper surfaces of the capacitor modules CM1 and CM2 are assumed to be cooled in this second embodiment, their side surfaces or plural surfaces may be cooled by modifying the arrangement of the capacitor modules CM1 and CM2 so as to change the module surfaces connected to the housing 27 including the inner housing 27-In. Even when the number of fixed points is increased with such a modification, stresses applied to the connecting portions can be moderated in this second embodiment because of the presence of the bent structure.

According to this second embodiment, as described above, in a vehicle-mounted electrical-mechanical system using the power converter INV to control the two motors MG1 and MG2, capacitors used in the two power modules PMU1 and PMU2 are constituted by the two capacitor modules CM1 and CM2 each having a low inductance, and one low-inductance capacitor module is always combined with one power module, whereby the jumping voltage can be reduced and interference can be avoided. Also, the remaining one capacitor module not connected at a low conductance serves to increase the capacitor capacity for current supply. As a result, a size reduction of the power converter INV can be realized.

Figure 21:
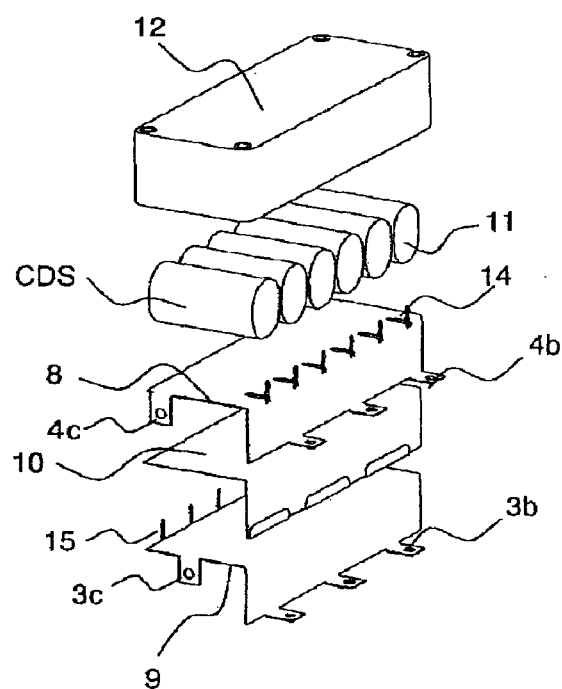
FIG. 21 is an exploded perspective view showing the construction of a capacitor module according to a third embodiment of the present invention.

The construction of a capacitor module according to a third embodiment of the present invention is shown in FIG. 21.

FIG. 21 is an exploded perspective view showing the construction of a capacitor module according to a third embodiment of the present invention. Note that, in FIG. 21, the same characters as those in FIG. 4 denote the same parts.

In this third embodiment, the basic construction of a capacitor module CM is the same as that of the capacitor module CM shown in FIGS. 4-10. However, the U-shaped bent structure, shown in FIG. 4, is not provided in the second flat portion of each of the layered wide conductors 8 and 9.

According to this third embodiment, although the effect of moderating stresses in the connecting portion is not so expected as the case including the bent structure, a certain effect of moderating stresses and reducing inductance can be realized because led-out portions of the wide conductors are in the layered form.

Figure 22:
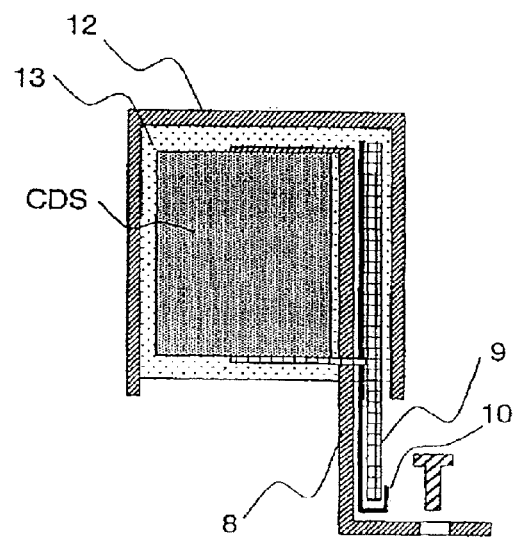
FIG. 22 is a sectional view showing the construction of a capacitor module according to a fourth embodiment of the present invention.

FIG. 22 is a sectional view showing the construction of a capacitor module according to a fourth embodiment of the present invention.

In this fourth embodiment, the basic construction of a capacitor module CM is the same as that of the capacitor module CM shown in FIGS. 4-10. The feature of this fourth embodiment resides in that the direction in which the capacitor cell CDS is oriented is changed from the orientation shown in FIG. 4. Because the capacitor cell CDS is fabricated by winding a film which is coated with a metal by vapor deposition, its thermal conductivity is anisotropic. Specifically, the thermal conductivity is higher in an axial direction CDS-Ax of the wound film than a radial direction CDS-Rad. Taking into account the above property, in this fourth embodiment, the axial direction CDS-Ax of the capacitor cell CDS is arranged to face an upper surface of the case 12 so that the capacitor cell CDS is oriented to ensure more efficient heat conduction at the upper surface of the case 12. As a result, the useful life of the capacitor cell CDS can be prolonged.

Figure 23:
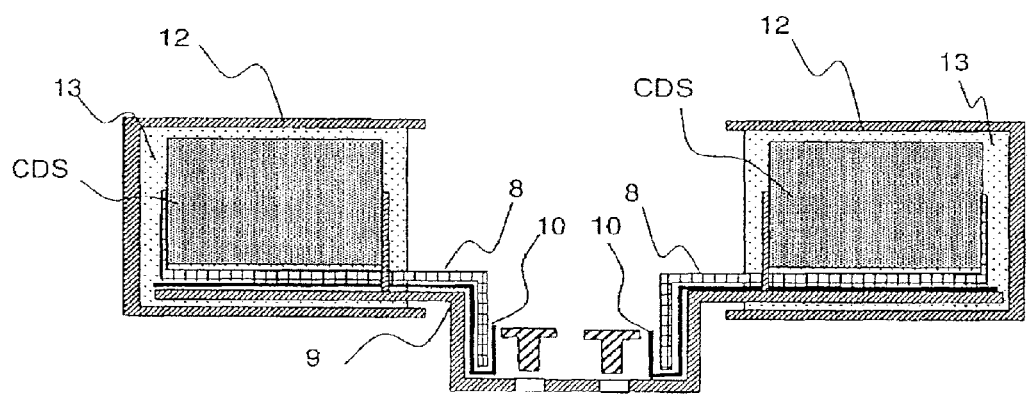
FIG. 23 is a sectional view showing the construction of a capacitor module according to a fifth embodiment of the present invention.

FIG. 23 is a sectional view showing the construction of a capacitor module according to a fifth embodiment of the present invention.

In this fifth embodiment, the basic construction of a capacitor module CM is the same as that of the capacitor module CM shown in FIGS. 4-10. The feature of this fifth embodiment resides in constituting, as one unit, the capacitor module CM of a power converter in a vehicle-mounted electrical-mechanical system controlling two motors, while realizing such an arrangement that one low-inductance capacitor module can be always connected to one power module and the remaining one capacitor module not connected at a low conductance also serves to increase the capacitor capacity for current supply. The capacitor module CM has a structure wherein a plurality of capacitor cells CDSs are supported on each of opposite ends of a laminate obtained by bringing two wide conductors into a layered form with an insulation sheet interposed between them, and the laminate is connected at its central position to the power module. That structure eliminates the need of accurately positioning two capacitor modules for screwing when those two capacitor modules are assembled. Further, while this fifth embodiment has a plurality of holes formed in a connecting portion of the laminate for connection to two power modules, the number of the holes formed in the connecting portion can be reduced and a bottom area can be further downsized when one power module containing the functions of two power modules is used.

According to the embodiments described above, the capacitor module having a low inductance and being able to moderate stresses in the connecting portions can be obtained.

Also, according to the embodiments, the power converter INV having a smaller size can be realized.

Further, according to the embodiments, the power converter INV for controlling the two motors MG1 and MG2 can be realized in smaller size.

In addition, according to the embodiments, the vehicle-mounted electrical-mechanical system equipped with the power converter INV for controlling the two motors MG1 and MG2 can be realized in smaller size.

What is claimed is:

1. A power converter comprising:
   a capacitor module for smoothing DC current supplied from a battery; and
   a power module having a power semiconductor device for converting said DC current to AC current, in a housing,
   wherein the capacitor module comprising:
   a case;
   a plurality of capacitor cells in which one and another electrodes are provided on respective end faces, and are arranged in the case;
   a first conductor plate which is connected with said first electrode;
   a second conductor plate which is connected with said second electrode; and
   resin which is filled up in the case-in order to hold the plurality of capacitor cells, the first conductor plate and the second conductor plate,
   wherein the first and the second conductor plates provide a first portion and a second portion respectively which are divided through a bending part,
   the first portions are arranged in the case, and are connected with the plurality of capacitor cells,
   the second portions project from the resin surface and are connected with the power module,
   wherein the power module provides
   a base plate on which the power semiconductor device is located, wherein the base plate formed as a heat dissipator,
   a power module case which is located on the base plate and is formed for surrounding the power semiconductor, and
   an external connecting conductor which is pulled out towards an exterior from the inside of the case of the power module, and connects with the first conductor plate or the second conductor plate directly, and transmits the direct current from the capacitor module to the power semiconductor device.

2. The power converter according to claim 1,
wherein the first portion and the second portion of the first conductor plate are formed in one, and the first portion and the second portion of the second conductor plate are formed in one.

3. The power converter according to claim 1,
wherein the capacitor cell is the film capacitor which was wound a film;
said film is coated with a metal by vapor deposition, and the electrode is constituted by both sides of the wound axis direction by metal spraying.

4. The power converter according to claim 1,
wherein the case has an opening,
the plurality of capacitor cells provides a side face and end faces which have the electrodes prepared in the both ends of the side face, and the side face faces the bottom within the case,
the first portion of the first conductor plate and the first portion of the second conductor plate are arranged between the capacitor cell and the opening of the case,
the first portion of the first conductor plate provides a plurality of first electrode connecting portion in which a part of the first portion of the first conductor plate is bent at a position corresponding to arrangement of the capacitor cell, and is connected with one electrode of the capacitor cell, and
the first portion of the second conductor plate provides a plurality of first electrode connecting portion in which a part of the first portion of the second conductor plate is bent at a position corresponding to arrangement of the capacitor cell, and is connected with another electrode of the capacitor cell.

5. The power converter according to claim 1, further comprising
through holes formed at the end of the side exposed from resin of the second portion of the first conductor plate and the second portion of the second conductor plate; and
screws which are inserted into the through holes and connect the first conductor plate or the second conductor plate with the power module.

6. The power converter according to claim 1,
wherein the case of the capacitor module is rectangular form, and
further comprising
a power module terminal which provided at least one of the second portion of the first conductor plate or the second portion of the second conductor plate, is projected from the resin at the end of the side which projected from the resin surface of one neighborhood of the case, and is connected with a power module, and
a battery terminal which provided at least one of the first portion of the first conductor plate or the first portion of the second conductor plate, is projected from the resin at the end of another side which projected from the resin surface of one neighborhood of the case, and receives direct current from the battery.

7. The power converter according to claim 1,
wherein the case provides a fixing hole in which a nut for fixing to the housing is buried.

8. The power converter according to claim 1,
further comprising a hole is formed at least one of the first conductor plate or the second conductor plate, and
the first conductor plate or the second conductor plate is supported at the resin by filling up the resin in the hole.

9. The power converter according to claim 1,
further comprising a bent portion is formed midway of a portion extending from the resin toward the direction which the power module is arranged of the second portion of the first conductor plate and the second portion of the second conductor plate.

10. The power converter according to claim 1,
wherein electrodes of at least one of the plurality of capacitor cells are arranged in direction reversal to a direction in which the electrodes of the other capacitor cells are arranged.

11. The power converter according to claim 1,
wherein the plurality of the capacitor cells have positive electrodes at ones of opposite end surfaces thereof and negative electrodes at the other end surfaces and are arrayed on the first conductor plate such that electrode direction from the positive electrodes to the negative electrodes are substantially parallel to each other in the case to one row, and
the electrode directions of adjacent capacitor cells are reversal to each other.

12. The power converter according to claim 1,
wherein the second portions project from the resin surfaces in the state where those parts are laminated through an insulated component.

* * * * *